United States Patent
Yamamiya

(10) Patent No.: US 7,952,640 B2
(45) Date of Patent: May 31, 2011

(54) IMAGE PICKUP ELEMENT MODULE, AND LENS UNIT AND PORTABLE ELECTRONIC DEVICE USING IMAGE PICKUP ELEMENT MODULES

(75) Inventor: Kunio Yamamiya, Sagamihara (JP)

(73) Assignee: Olympus Imaging Corp. (JP)

( * ) Notice: Subject to any disclaimer, the term of this patent is extended or adjusted under 35 U.S.C. 154(b) by 494 days.

(21) Appl. No.: 12/107,990

(22) Filed: Apr. 23, 2008

(65) Prior Publication Data

US 2008/0316344 A1    Dec. 25, 2008

(30) Foreign Application Priority Data

May 1, 2007 (JP) ................................. 2007-121126

(51) Int. Cl.
*H04N 5/228* (2006.01)
*H01J 7/24* (2006.01)
*H01J 40/14* (2006.01)
*H01J 23/34* (2006.01)

(52) U.S. Cl. ......................... 348/373; 250/238; 257/712

(58) Field of Classification Search .................. 348/373, 348/374; 250/238, 239; 257/467, 712, 714, 257/717

See application file for complete search history.

(56) References Cited

U.S. PATENT DOCUMENTS

| 6,307,590 | B1 * | 10/2001 | Yoshida | 348/340 |
|---|---|---|---|---|
| 7,120,025 | B2 * | 10/2006 | Hirano | 361/704 |
| 7,570,303 | B2 * | 8/2009 | Maruno | 348/374 |
| 7,710,460 | B2 * | 5/2010 | Stavely | 348/208.99 |
| 2004/0075870 | A1 * | 4/2004 | Karaki | 358/296 |
| 2006/0088271 | A1 * | 4/2006 | Ghoshal | 385/147 |
| 2007/0171615 | A1 * | 7/2007 | Xia et al. | 361/700 |

FOREIGN PATENT DOCUMENTS

| JP | 2-143152 | 6/1990 |
|---|---|---|
| JP | 2005-93848 | 4/2005 |
| JP | 2006-174226 | 6/2006 |
| JP | 2006-332894 | 12/2006 |

* cited by examiner

*Primary Examiner* — Kelly L Jerabek
(74) *Attorney, Agent, or Firm* — Volpe and Koenig P.C.

(57) ABSTRACT

In an image pickup element module, a heat releasing member disposed to be thermally coupled to an FPC substrate and an image pickup element is formed of a PPS resin material having good thermal conductivity. Further, this image pickup element module is configured so that a phase-changing heat storage which is insert-molded or formed into a sheet shape is disposed to be thermally coupled to the heat releasing member.

8 Claims, 13 Drawing Sheets

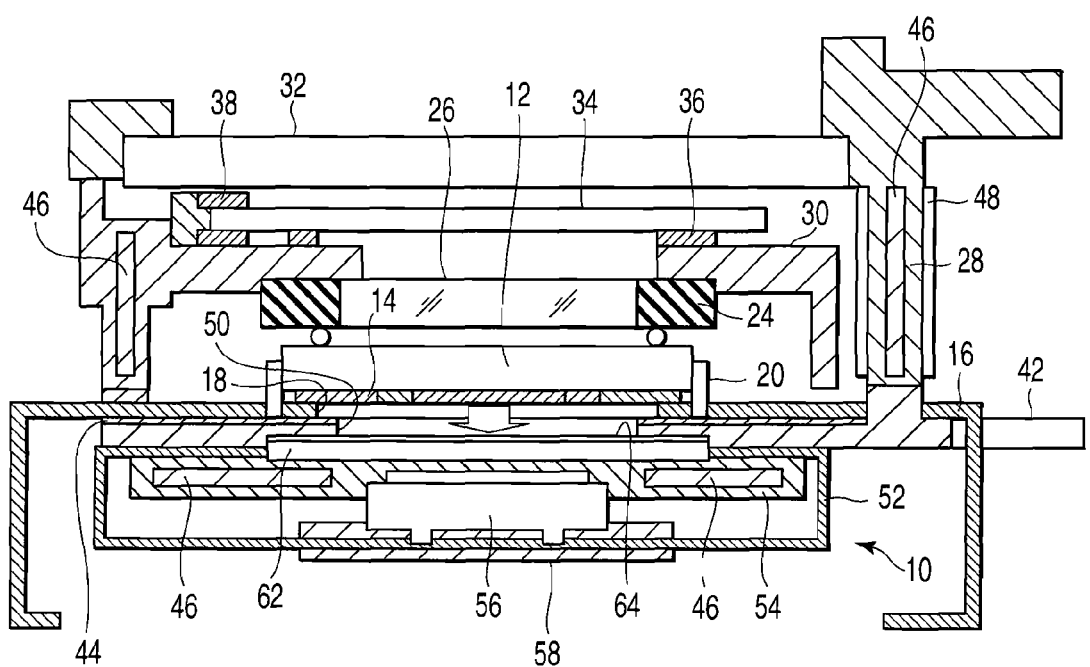
F I G. 1

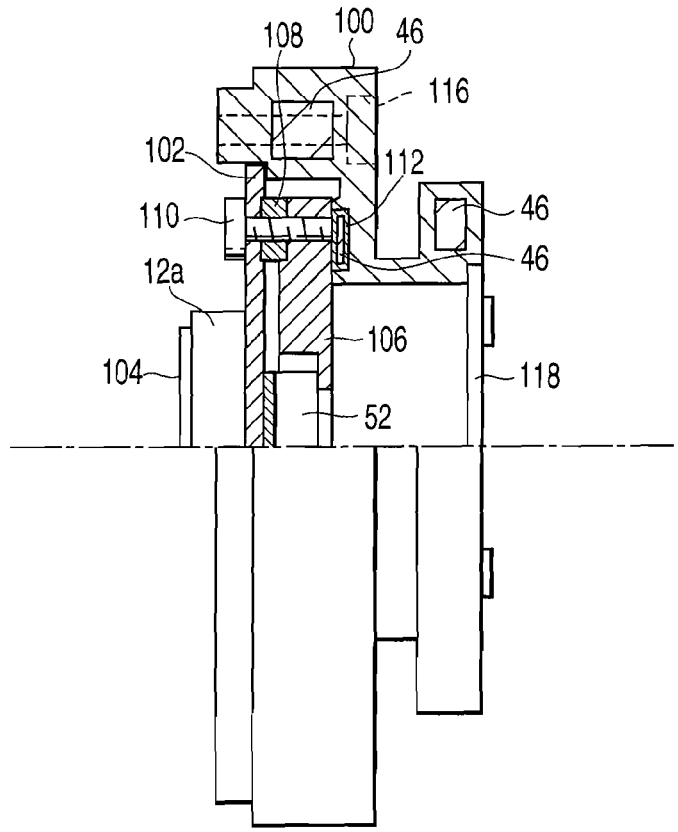
F I G. 5
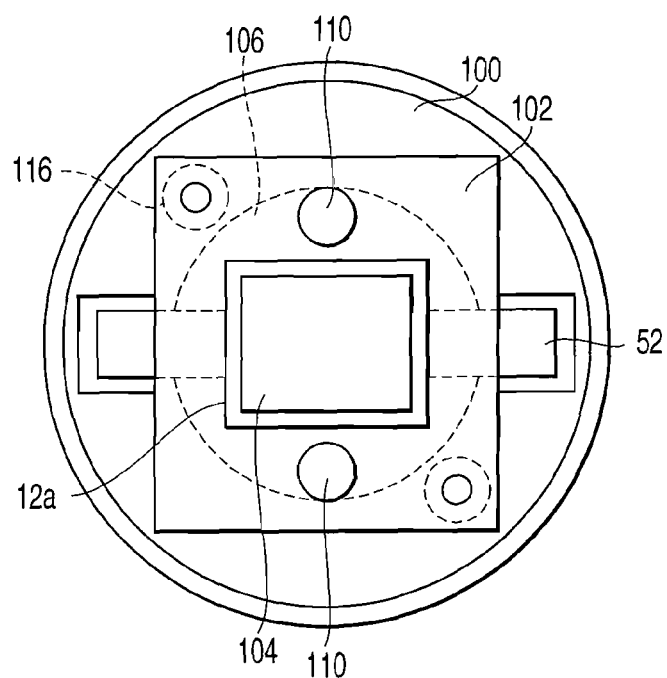
F I G. 6

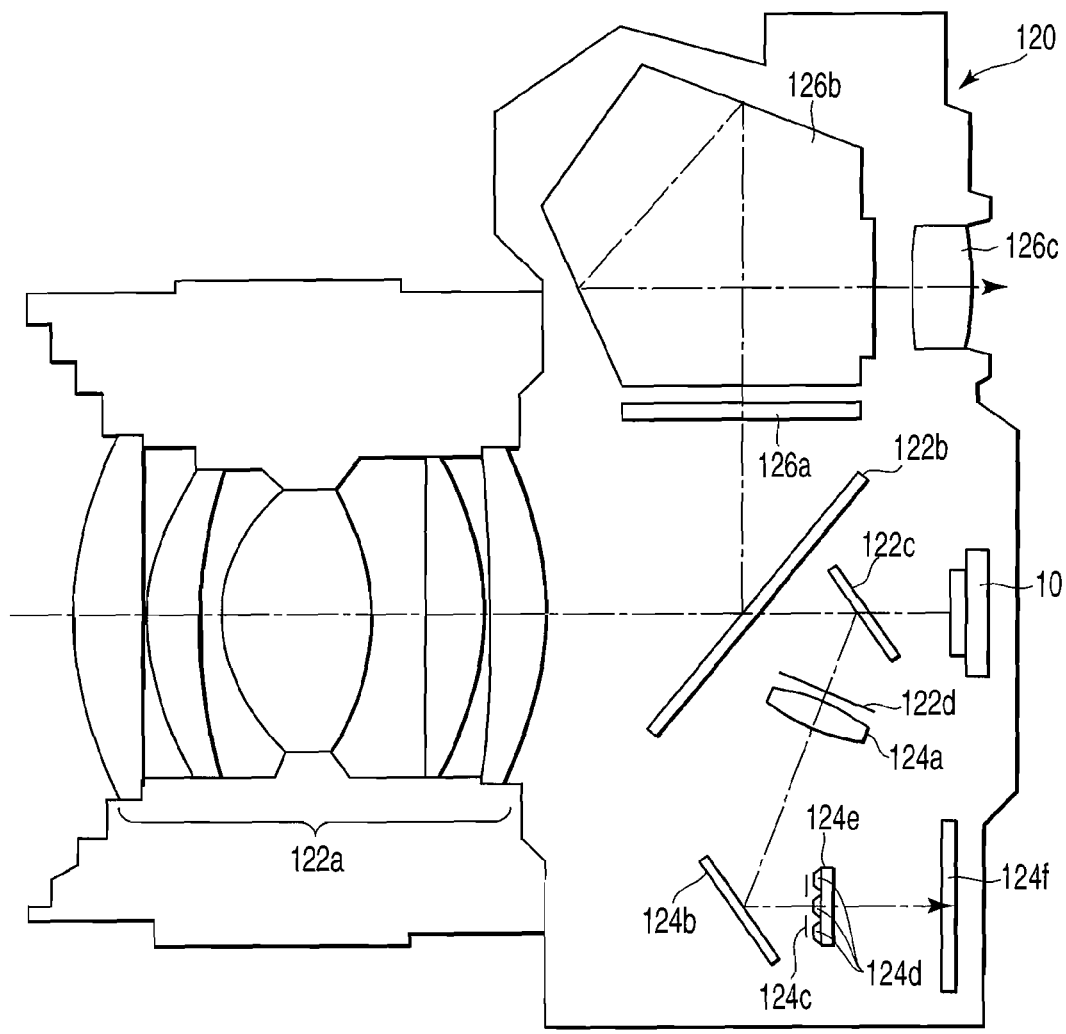
F I G. 7

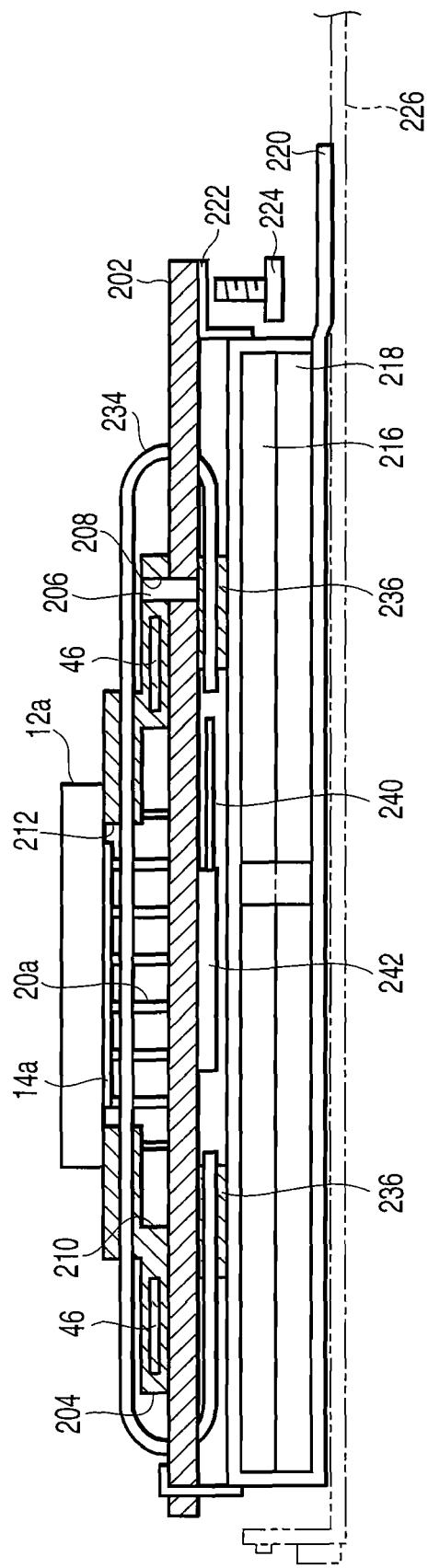
F I G. 11

IMAGE PICKUP ELEMENT MODULE, AND LENS UNIT AND PORTABLE ELECTRONIC DEVICE USING IMAGE PICKUP ELEMENT MODULES

CROSS-REFERENCE TO RELATED APPLICATIONS

This application is based upon and claims the benefit of priority from prior Japanese Patent Application No. 2007-121126, filed May 1, 2007, the entire contents of which are incorporated herein by reference.

BACKGROUND OF THE INVENTION

1. Field of the Invention

The present invention relates to, for example, a lens unit and a portable electronic device, and more particularly, it relates to the cooling structure of their image pickup element modules.

2. Description of the Related Art

Generally, in an electronic device of the above-mentioned type, when an image pickup element as an electronic component and a central processing unit (CPU) configuring a control circuit are internally mounted, it is requested to take thermal measures after they have been dust-proofed. As to the thermal measures, higher dust-proofness increases the temperature of the electronic component, while a higher noise level, in the case of an electronic camera apparatus, causes deterioration in image quality. Therefore, the above-mentioned thermal measures are especially one of the important issues due to recent enhanced performance of the image pickup element and CPU.

Thus, as such heat releasing structures, there have been proposed liquid-cooling and air-cooling type structures in, for example, Jpn. Pat. Appln. KOKAI Publication No. 02-143152, Jpn. Pat. Appln. KOKAI Publication No. 2006-332894, Jpn. Pat. Appln. KOKAI Publication No. 2006-174226 and Jpn. Pat. Appln. KOKAI Publication No. 2005-93848.

Jpn. Pat. Appln. KOKAI Publication No. 02-143152 discloses the liquid-cooling type configuration in which a cooling plate is brought in contact with the surfaces of integrated circuit elements installed on a circuit substrate, and, for example, cooling water is supplied to a micro cooling medium flow path to water-cool the cooling plate. Then, a thermally conductive deformable substance such as a compound having good thermal conductivity is interposed in a thermal junction between the cooling plate and the integrated circuit elements to increase a contact area, thereby attempting to achieve good thermal conductivity.

Specifically, a large number of integrated circuit elements are installed on one side of the circuit substrate such as a ceramic plate. Further, a liquid-cooling module disposed on the circuit substrate has a configuration in which a thermally conductive deformable substance, such as a compound having good thermal conductivity, is interposed between the cooling plate to which a cooling medium is supplied from the cooling medium flow path and the surfaces of integrated circuit elements. Then, the cooling plate and the integrated circuit elements are satisfactorily thermally joined together by the pressure of a spring. Moreover, liquid supply means comprises a cooling medium supply pipe coupled to the cooling medium flow path, an on-off valve and a mechanical pump.

Furthermore, Jpn. Pat. Appln. KOKAI Publication No. 2006-332894 discloses an image pickup device adopting an air-cooling method, and this image pickup device comprises a body side mount which is incorporated in a main body structure within a camera body and which supports a photography lens, a shutter disposed in an opening of the main body structure along an optical axis, an image pickup unit, etc. That is, as the image pickup unit, there are provided an image pickup element fixing plate fixedly supported on the main body structure, an optical low pass filter, a protective glass and a bare chip type image pickup element. In this image pickup element, the image pickup element fixing plate configuring a heat releasing plate is adhesively bonded and fixed to the non-image-pickup-side surface of the image pickup element, so that the distance in the optical axis direction from the surface of the body side mount to an image pickup surface (photoelectric conversion surface) of the image pickup device is accurately set. Thus, heat generated due to the operation of the image pickup element is released via the image pickup element fixing plate, such that the rising of the temperature of the image pickup element is suppressed.

Furthermore, Jpn. Pat. Appln. KOKAI Publication No. 2006-174226 discloses an image pickup unit with a hand movement correction function of an image pickup element rocking type, wherein an image pickup element comprising a package, a lead frame, a cover glass, etc. is mounted on a circuit substrate so that a heat absorbing surface of a cooling element such as a Peltier element may be in contact with an opening provided in the circuit substrate via a plastic sheet on the back surface of the package. A small heat releasing member is disposed between the back surface of the package and the heat absorbing surface of the cooling element, and a large heat releasing member is disposed on a case side, so that these members are thermally coupled to each other by a heat transmitting member.

Furthermore, Jpn. Pat. Appln. KOKAI Publication No. 2005-93848 discloses a cooling structure, wherein a heat storage configured by a heat storage member for storing heat using latent heat is inserted by a screw structure into a heat receiving portion of a cooling member made of a metal material in which a heat generator is installed, thereby achieving higher cooling efficiency as well as a size reduction of the cooling member.

BRIEF SUMMARY OF THE INVENTION

It is therefore an object of the present invention to provide an image pickup element module, and a lens unit and a portable electronic device using image pickup element modules, wherein with a simple configuration, it is possible to achieve a highly efficient thermal transfer to obtain higher cooling efficiency and achieve an improvement in the degree of freedom in manufacture including designing.

An object of the present invention is to provide an image pickup element module comprising:

a printed wiring substrate provided with an opening;

an image pickup element installed on the printed wiring substrate so that a backside insulating sheet faces the opening on the printed wiring substrate;

a resin heat releasing member which is made of a synthetic resin material filled with fillers having high thermal conductivity and which is disposed to be thermally coupled to the printed wiring substrate and the image pickup element; and a phase-changing heat storage which is disposed to be thermally coupled to the resin heat releasing member and which is insert-molded or formed into a sheet shape.

Another object of the present invention is to provide an image pickup element module comprising:

a printed wiring substrate provided with an opening;

an image pickup element installed on the printed wiring substrate so that a backside insulating sheet faces the opening on the printed wiring substrate;

a metal heat releasing member which is made of a metal material and which is disposed to be thermally coupled to the printed wiring substrate and the image pickup element;

a resin heat releasing member which is made of a synthetic resin material filled with fillers having high thermal conductivity and in which an optical element is disposed and which is thermally coupled to the metal heat releasing member; and a phase-changing heat storage which is disposed to be thermally coupled to the resin heat releasing member and which is insert-molded or formed into a sheet shape.

An object of the present invention is to provide a lens unit comprising:

a lens main body to which an image pickup lens is attached; and an image pickup element module disposed face to face with the image pickup lens of the lens main body, the image pickup element module including:

a printed wiring substrate provided with an opening;

an image pickup element which is installed on the printed wiring substrate and which has a backside insulating sheet disposed face to face with the opening, and a light receiving surface, the light receiving surface of the image pickup element being installed in alignment with the optical axis of the image pickup lens;

a phase-changing heat storage which is insert-molded or formed into a sheet shape; and a resin heat releasing member which is made of a synthetic resin material filled with fillers having high thermal conductivity and to which the heat storage is thermally coupled, wherein the heat storage is thermally coupled to the resin heat releasing member to arrange the printed wiring substrate and the image pickup element.

Another object of the present invention is to provide a lens unit comprising:

a lens main body to which an image pickup lens is attached; and an image pickup element module disposed face to face with the image pickup lens of the lens main body, the image pickup element module including:

a printed wiring substrate provided with an opening;

an image pickup element which is installed on the printed wiring substrate and which has a backside insulating sheet disposed face to face with the opening, and a light receiving surface, the light receiving surface of the image pickup element being installed in alignment with the optical axis of the image pickup lens;

a metal heat releasing member made of a metal material;

a phase-changing heat storage which is insert-molded or formed into a sheet shape in the metal heat releasing member so that the heat storage is thermally coupled to the metal heat releasing member; and a resin heat releasing member which is made of a synthetic resin material filled with fillers having high thermal conductivity and to which the heat storage is thermally coupled, wherein the heat storage is thermally coupled to the resin heat releasing member to arrange the printed wiring substrate and the image pickup element.

An object of the present invention is to provide a portable electronic device comprising:

a device case which is made of a synthetic resin material filled with fillers having high thermal conductivity and in which an image pickup lens is installed and to which a phase-changing heat storage is thermally coupled, an optical element being disposed in the heat storage, the heat storage being insert-molded or formed into a sheet shape;

an image pickup element module disposed face to face with the image pickup lens of the device case;

the image pickup element module including:

a printed wiring substrate provided with an opening;

an image pickup element which is installed on the printed wiring substrate and which has a backside insulating sheet disposed face to face with the opening, and a light receiving surface, the light receiving surface of the image pickup element being installed in alignment with the optical axis of the image pickup lens; and a metal heat releasing member made of a metal material, and a display unit which is thermally coupled to the metal heat releasing member thermally coupled to the device case and which is provided in the device case and which displays image data acquired in the image pickup element.

According to the present invention, when the image pickup element is driven and generates heat, the heat is transferred to the resin heat releasing member from the backside insulating sheet through the opening of the printed wiring substrate, and the heat storage of the resin heat releasing member changes phase. Thus, the resin heat releasing member is kept at a constant temperature, and the resin heat releasing member releases the transferred heat, thereby thermally controlling the temperature of the image pickup element at a permissible value. Therefore, with a simple configuration, the heat of the printed wiring substrate including the heat of the image pickup element can be efficiently released via the resin heat releasing member, thereby achieving highly efficient cooling and achieving an improvement in the degree of freedom in manufacture including the thermal design of the module.

Furthermore, according to the present invention, when the image pickup element is driven and generates heat, the heat is transferred to the metal heat releasing member from the backside insulating sheet through the opening of the printed wiring substrate, and then released. At the same time, the heat transferred to the metal heat releasing member is transferred to the resin heat releasing member, and the heat storage of the resin heat releasing member changes phase. Thus, the resin heat releasing member is kept at a constant temperature, and the resin heat releasing member releases the transferred heat, thereby thermally controlling the temperature of the image pickup element at a permissible value. Therefore, with a simple configuration, the heat of the printed wiring substrate including the image pickup element can be efficiently released via the resin heat releasing member, thereby achieving highly efficient cooling and achieving an improvement in the degree of freedom in manufacture including the thermal design of the module.

Furthermore, according to the present invention, when the image pickup element is driven and generates heat, the heat is transferred to the resin heat releasing member from the backside insulating sheet through the opening of the printed wiring substrate, and the heat storage of the resin heat releasing member changes phase. Thus, the resin heat releasing member is kept at a constant temperature, and the resin heat releasing member releases the transferred heat, thereby thermally controlling the image pickup element at a permissible value. Therefore, with a simple configuration, the heat of the printed wiring substrate including the image pickup element can be efficiently released via the resin heat releasing member, thereby achieving highly efficient cooling and achieving an improvement in the degree of freedom in manufacture including its thermal design.

According to the present invention, when the image pickup element is driven and generates heat, the heat is transferred to the metal heat releasing member from the backside insulating sheet through the opening of the printed wiring substrate, and then released. At the same time, the heat transferred to the metal heat releasing member is transferred to the resin heat releasing member, and the heat storage of the resin heat releasing member changes phase. Thus, the resin heat releasing member is kept at a constant temperature, and the resin heat releasing member releases the transferred heat, thereby thermally controlling the image pickup element at a permissible value. Therefore, with a simple configuration, the heat of the printed wiring substrate including the image pickup element can be efficiently released via the resin heat releasing member, thereby achieving highly efficient cooling and achieving an improvement in the degree of freedom in manufacture including its thermal design.

Furthermore, according to the present invention, when the image pickup element is driven and generates heat, the heat is transferred to the metal heat releasing member from the backside insulating sheet through the opening of the printed wiring substrate, and then released. At the same time, the heat transferred to the metal heat releasing member is transferred to the device case, and the heat storage of the device case changes phase. Thus, the device case is kept at a constant temperature, and the device case releases the transferred heat, thereby thermally controlling the image pickup element at a permissible value.

Therefore, with a simple configuration, the heat of the printed wiring substrate including the image pickup element can be efficiently released via the resin heat releasing member, thereby achieving highly efficient cooling and achieving an improvement in the degree of freedom in manufacture including its thermal design.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a sectional view showing an image pickup element module according to one embodiment of the present invention;

FIG. 5 is a partial sectional view showing a modification of the lens unit in FIG. 4 and a configuration in which the lens unit is set using a lens side mount member;

FIG. 6 is a plan view showing the lens side mount member in FIG. 5 from the side of the light receiving surface;

FIG. 7 is a configuration explaining diagram shown to explain a single lens reflex electronic camera using the image pickup element module in FIG. 1;

FIG. 11 is a sectional view shown to explain the configuration of an image pickup element module according to another embodiment of the present invention;

DETAILED DESCRIPTION OF THE INVENTION

An image pickup element module, and a lens unit and a portable electronic device using image pickup element modules according to an embodiment of the present invention will hereinafter be described in detail with reference to the drawings.

Figure 2:
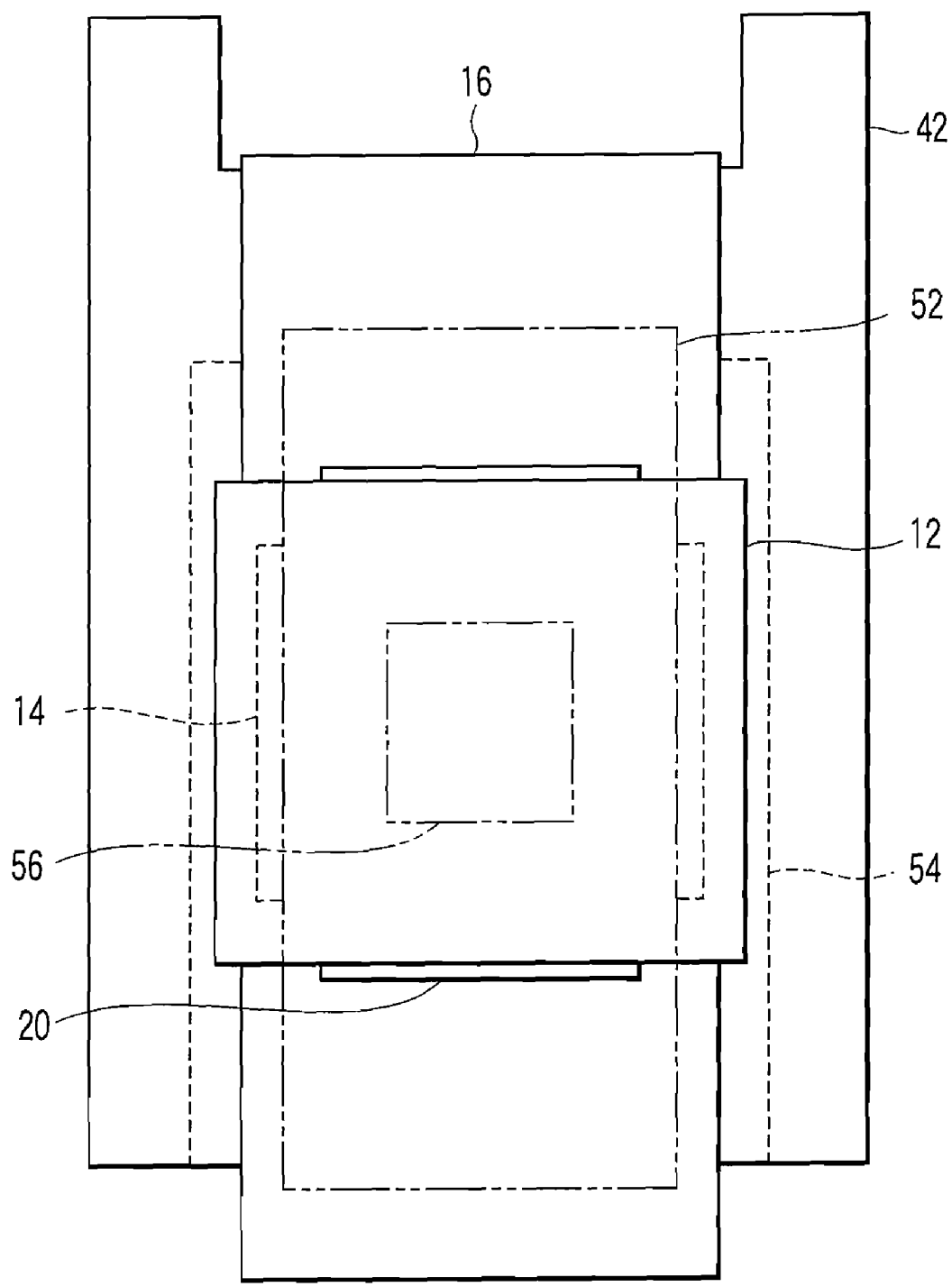
FIG. 2 is a plan view from the side of a light receiving surface of an image pickup element in which an optical low pass filter, a dust-proof mechanism and a shutter in FIG. 1 are omitted.

FIG. 1 is a sectional view showing an example in which an image pickup element module 10 according to one embodiment of the present invention is applied to an electronic camera which is a portable electronic device. FIG. 2 is a plan view from the side of a light receiving surface of an image pickup element in which an optical low pass filter, a dust-proof mechanism and a shutter in FIG. 1 are omitted.

In FIG. 1, an image pickup element 12 of a so-called bare chip type is covered with, on its backside, a backside insulating sheet 14 of a predetermined shape by, for example, adhesive bonding.

In addition, a heat reflecting member which is preferably, for example, an unshown infrared reflecting member is joined onto the backside insulating sheet 14 of the image pickup element. This heat reflecting member is formed of, for example, an aluminum material with a mirror finish, and its surface is coated with, for example, a metal foil, metal oxide or an infrared cut filter, or a layer of white paint is coated onto this surface, such that the heat reflecting member undergoes a surface treatment with an emissivity of 0.1 to 0.6 or less. This heat reflecting member releases the heat from the image pickup element 12 as infrared rays and reflects the infrared rays from the outside, and can therefore suppress a repeated rise of the temperature of the image pickup element 12 due to radiant heat.

The image pickup element 12 is installed on an elastically deformable flexible printed wiring substrate (hereinafter referred to as an FPC substrate) so that its backside insulating sheet 14 faces a heat releasing opening 18 provided in, for example, the FPC substrate 16. Then, the image pickup element 12 is electrically connected to the FPC substrate 16 via a lead terminal 20.

In this image pickup element 12, an optical low pass filter 26 set within a rubber frame 24 is coaxially disposed on its light receiving surface. The rubber frame 24 of the optical low pass filter 26 is supported on a holding portion 30 provided in a frame member 28, which is a lens frame configuring a device case and which is made of a material having good thermal conductivity, such as a polyphenylene sulfide resin (hereinafter referred to as a PPS resin) molding material filled with granular graphite and carbon or glass fiber, or silicon rubber or urethane rubber filled with carbon fiber. Then, a shutter 32 is set at the distal end of the frame member 28 face to face with the optical low pass filter 26.

Furthermore, a transparent glass substrate 34 configuring a dust-proof mechanism is disposed on the holding portion 30 of the frame member 28 between the optical low pass filter 26 and the shutter 32. Moreover, the transparent glass substrate 34 is airtightly disposed on the optical low pass filter 26 with an oscillating member 36 configured by, for example, a piezo-electric element interposed therebetween so that its upper side is pressed by a press member 38 in a freely oscillating manner. When the oscillating member 36 is driven via an unshown drive control unit and oscillated, the transparent glass substrate 34 oscillates in an airtight state against the elastic force of the press member 38 and thus removes, for example, dust adhering to its upper surface to prevent the dust from entering the optical low pass filter 26.

Furthermore, disposed on the backside of the image pickup element 12 is an element support member 42 which is formed of a material having good thermal conductivity such as aluminum, stainless steel or a PPS resin molding material and which configures a heat releasing member. Joining and setting to this element support member 42 are accomplished by the technique using, for example, an adhesive 44 having high thermal conductivity when aluminum or stainless steel is used for the backside of the FPC substrate 16, or by the technique of insert molding (without using the adhesive 44) which directly supports the FPC substrate 16 when the PPS resin is used.

Here, the frame member 28 is formed of a synthetic resin material having good thermal conductivity in which fillers of, for example, a metal oxide or ceramic are mixed, such as a polyphenylene sulfide (PPS) resin in which spheroidal graphite is filled with glass fiber, a carbon resin, etc. A phase-changing heat storage 46 made of a phase-changing material is disposed to be thermally coupled to the frame member 28 by, for example, insert molding in proximity to the element support member 42.

Here, the frame member may be made of a metal material, and a resin sheet in which a heat storage member is formed may be joined onto the surface of the metal. In such a case, the cost for the frame member of a mirror box can be reduced.

This heat storage 46 is configured by a heat storage microcapsule in which a core material is covered with a container, and this core material is, for example, paraffin, an organic heat storage material such as paraffin filled with carbon fiber made of a substance easily transmitting heat and a gel agent capable of maintaining a solid shape even at a melting temperature or more, or paraffin or inorganic hydrated salt filled with a polymer. This heat storage 46 is formed to be able to melt or solidify by changing phase at a temperature equal to or less than the service temperature limit of the image pickup element 12, for example, at 60 to 80° C. Thus, the heat storage 46 keeps the frame member 28 at a constant temperature of 60 to 80° C., which is equal to or less than the service temperature limit of the image pickup element 12, thereby thermally controlling the image pickup element 12 at a desired value.

The organic heat storage material constituting the heat storage 46 is formed of, for example, paraffin or paraffin filled with carbon fiber having high thermal conductivity. The organic heat storage material can also be a core material formed as a heat storage microcapsule containing paraffin covered with a polymer or containing an inorganic hydrated salt, or a synthetic material mixed into a synthetic resin. Moreover, while the melting point of the heat storage 46 is 60° C. or more, it can be replaced with an inorganic substance (e.g., sodium acetate pentahydrate) which melts at 45° C. to 59° C.

Thus, by use of the technique of insert-molding the heat storage 46 into the PPS resin or the adhesive bonding technique of joining the heat storage 46 to a metal material, it is possible to provide a heat releasing plate member shaped with a small area and a small thickness, thereby enabling a reduction in size.

Furthermore, the frame member 28 is provided, on its wall surface, with a reinforcing rib 48 concavely and convexly formed in a direction perpendicular to the surface of the drawing. This reinforcing rib 48 ensures strength in a liquefied state of the heat storage 46.

The element support member 42 is provided with an opening 50 to correspond to the backside insulating sheet 14 of the image pickup element 12. Further, part of, for example, a loop flat-plate-type heat pipe (registered trademark) 52 configuring, face to face with the opening 50, a phase-changing flow path for transferring heat by use of the phase change of a working fluid is disposed face to face with the element support member 42. Used as this flat-plate-type heat pipe 52 is a flat-plate-shaped or rod-shaped pipe in which a so-called wick is provided on its inner wall, such as a "micro heat pipe having a thickness of 1 mm" disclosed in Furukawa Electric Review No. 114 or a "heat pipe having good thermal conductivity" manufactured by Nippon Metal Industry Co., Ltd.

A later-described pump connecting member using a metal material having high thermal conductivity, such as aluminum or stainless steel, is disposed in a condensation part (heat releasing side) of the heat pipe 52. Moreover, while copper or a copper alloy is used for the heat pipe 52, it can be replaced, from the viewpoint of plasticity, mass productivity, etc., with an insert-molded product of a PPS resin in which granular graphite is filled with alumina powder and glass fiber or carbon fiber.

In the element support member 42, for example, an unshown recess is formed at a position where the heat pipe 52 is disposed. Part of the heat pipe 52 is positioned at and disposed in this recess (not shown) so that it is contained therein using a double-sided tape via a heat conductive member having good thermal conductivity. This enables the heat pipe 52 to be easily set and disposed in the element support member 42. In addition, when the insert-molded product of the PPS resin is used for the element support member 42, the heat pipe 52 is structured to be directly embedded in the element support member 42, and not using, for example, the double-sided tape drastically improves the thermal coupling (thermal conduction) from the heat pipe 52 to the element support member 42.

The heat from the image pickup element 12 is transmitted to the element support member 42 and the heat pipe 52. Then, this heat is temporarily absorbed by the heat storage 46 of the frame member 28. This heat storage 46 melts or solidifies at a melting point of, for example, about 60 to 80° C., which is equal to or less than the service limit of the image pickup element 12, and thus keeps the frame member 28 at a constant temperature. This makes it possible to suppress a rapid rise in the temperature of the FPC substrate 16 including the image pickup element 12.

The element support member 42 is thermally coupled to a later-described camera main body 120 (see FIG. 7) which is, for example, the device case, and the element support member 42 is configured to be able to discharge heat by transferring, for example, the heat transferred by thermal conduction from the image pickup element 12 to the camera main body 120. Then, the element support member 42 to which the frame member 28 is joined is positioned at and attached to a module supporter provided in, for example, the device case (not shown), and disposed so that its optical direction is positioned and fixed.

The heat pipe 52 is thermally coupled to a heat releasing member 54 so that, for example, the peripheral portion of the opening 50 of the element support member 42 serving as a heat absorbing side is supported on the heat releasing member 54. This heat pipe 52 stores a working fluid using, for example, a dispersion liquid of a microcapsule containing purified water, an alcohol, a known latent heat storing material or a reversible heat discoloration pigment capable of start generating color at a high temperature (e.g., 59° C.) and memorizing the color. Then, the heat pipe 52 absorbs the heat radiated from the backside insulating sheet 14 of the image pickup element 12, and transfers the heat by phase change, and thus releases the heat by the inversion of the phase change.

This heat releasing member 54 is formed of a synthetic resin material having a good thermal conductivity, similarly to that of the frame member 28, and the phase-changing heat storage 46 is disposed within the heat releasing member 54 in such a manner as to be thermally coupled thereto by a technique such as the insert molding. Further, the heat releasing member 54 is attached to the element support member 42 using an adhesive or a screw member. Thus, when the heat from the image pickup element 12 is transferred from the heat pipe 52 and the element support member 42, the heat storage 46 of the heat releasing member 54 temporarily absorbs the heat and kept at a constant temperature, and releases the heat in this state.

Furthermore, a ceramic sheet 54a is joined to the heat releasing member 54, and this ceramic sheet 54a has a thickness of 0.15 mm and is made of a chemically engraved, saw-toothed or waved plastic material in the form of a lattice having a large number of regular or irregular squares (e.g., one side is about 100 to 500 microns). Moreover, a silicon sheet may be used instead of the ceramic sheet. When such a sheet having high heat releasing properties is used, the heat releasing member 54 may be replaced with, for example, a synthetic resin (e.g., a PPS resin or polycarbonate (PC) resin) which has a thermal conductivity of 1 W/mK or more and which is filled with fillers such as carbon fiber, aluminum powder or aluminum hydroxide. Thus, after heat is conducted from the heat releasing member 54 to the ceramic sheet 54a, infrared rays are released and absorbed between a pair of opposite ceramic sheets spaced at a predetermined distance, such that a temperature rise on the backside of the image pickup element is suppressed, and the heat releasing properties can be enhanced.

Furthermore, in the heat pipe 52, there is disposed, to configure fluid circulating means in the intermediate portion of the heat pipe 52, a known synthetic resin pump, as disclosed in, for example, Jpn. Pat. Appln. KOKAI Publication No. 2003-28068, or a piezoelectric pump (or a trochoid small pump) 56, in which a heat insulating member is interposed between a pump and the heat releasing member 54. In addition, a pump connecting member 58 is provided in the heat pipe 52 via the piezoelectric pump 56 thermally isolated from the heat releasing member 54. This pump connecting member 58 serves as the condensation part.

If the above-mentioned wick is formed in the condensation part, it is also possible to omit, for example, the piezoelectric pump 56. In this case, the pump connecting member 58 serves as the condensation part of the heat pipe 52, and if a heat insulating member (replacement of the piezoelectric pump 56) is interposed between this condensation part and the heat releasing member 54, it is possible to suppress the conduction of the heat of the heat releasing member 54 to the pump connecting member 58.

The piezoelectric pump 56 is driven so that, for example, the driving frequency of the piezoelectric vibrator of the piezoelectric pump is controlled to control the number of the feeding of this pump and so that thermal equilibrium is provided between the heat absorbing side and heat releasing side of the piezoelectric pump to increase the piezoelectric constant and thus increase the displacement of the piezoelectric pump. This eliminates the need for a drive circuit for controlling the number of the feeding of the piezoelectric pump 56.

That is, the piezoelectric pump 56 comprises an unshown temperature sensor disposed on the printed wiring substrate. The temperature of the image pickup element 12 is detected at regular time intervals by this temperature sensor, and an operating time is selected and controlled by, for example, an unshown timer on the basis of the detection signal.

Specifically, the relation between the temperature of the image pickup element 12 and the operating time at the driving frequency is previously stored in an unshown memory, and the increase of the temperature of the image pickup element 12 is started. Then, when a predetermined period of time has passed, the driving time and stopping time of the piezoelectric pump 56 are controlled in accordance with information stored in the memory, on the basis of the detection signal of the temperature sensor (not shown). This can reduce the power consumption of a battery.

For example, the piezoelectric pump 56 is driven on the basis of the detection signal of the temperature sensor (not shown) in a photography mode or a display mode for displaying taken images in a display screen in an electronic camera, such that the piezoelectric pump 56 is controlled to force the working fluid to circulate without stopping. This makes it possible to effectively reduce the temperature of the image pickup element 12.

Moreover, the heat pipe 52 may be configured so that the working fluid may circulate between the heat absorbing side and the heat releasing side by use of phase change, without disposing the piezoelectric pump 56, which is the fluid circulating means.

Furthermore, in the heat pipe 52, a heat absorbing member 62, which is a member for absorbing infrared rays, is joined to, for example, the outer wall of this heat pipe 52 facing the backside insulating sheet 14 of the image pickup element 12. This heat absorbing member 62 is formed of an aluminum alloy material. Then, the front side of the heat absorbing member 62 is subjected to, for example, a black alumite treatment, spline processing, or graining or embossing (a regular or irregular concave and convex shape) for scattering the PPS resin filled with granular graphite and carbon or glass fiber and for scattering infrared rays, so that a heat absorbing surface 64 having a low reflectance for infrared rays and having enhanced heat absorbing properties is formed with an emissivity of 0.9 or more, in which case more satisfactory effects can be expected. Thus, in the heat pipe 52, the heat transferred by heat release or convection from the backside insulating sheet 14 of the image pickup element 12 through the opening 50 of the element support member 42 is efficiently absorbed by the heat absorbing surface 64, thereby allowing a highly efficient phase change (vaporization) of the working fluid.

When the heat from the backside insulating sheet 14 of the image pickup element 12 is transferred to the heat pipe 52 by thermal conduction, the backside insulating sheet 14 is thermally coupled to the heat absorbing surface 64 of the heat pipe 52 using, for example, a heat conducting rubber material. Thus, the heat pipe 52 has the same length as that of the backside insulating sheet 14 of the image pickup element 12, and the heat of the heat pipe 52 is transferred by thermal conduction, thereby enabling a further improvement in cooling efficiency.

Furthermore, the backside insulating sheet 14 of the image pickup element 12 may be configured to be connected to the outer wall of the heat pipe 52.

For example, the pump connecting member 58 thermally isolated from the heat releasing member 54 is disposed to be thermally coupled to the heat releasing side of the heat pipe 52. Thus, the heat pipe 52 can obtain a sufficient phase-changing area on its heat absorbing side and heat releasing side. Therefore, it is possible to efficiently absorb and release the heat transferred by thermal convection or thermal radiation and achieve highly efficient cooling of the image pickup element 12.

Furthermore, the FPC substrate 16 is thermally coupled to the element support member 42, and the heat generated in the image pickup element 12 and the heat of other electronic components installed on the FPC substrate 16 is transferred to the element support member 42 by thermal conduction by way of the FPC substrate 16. The heat conducted to this element support member 42 is transferred from the element support member 42 to the device case (not shown), and then released.

Owing to the configuration described above, the heat generated in the image pickup element 12 is transferred by convection or thermal conduction to the heat absorbing surface 64 of the heat pipe 52 from the backside insulating sheet 14, and is also transferred to the element support member 42 by thermal conduction. Here, the heat pipe 52 absorbs the heat by the heat absorbing surface 64 of the heat pipe 52. Thus, the working fluid therein changes phase and vaporizes, and moves into the flow path and liquefies, and then releases the heat, such that the image pickup element 12 is deprived of the heat and cooled off.

At the same time, the heat generated in the image pickup element 12 is transferred by thermal conduction to the element support member 42, and discharged in, for example, the device case (not shown) via the element support member 42, and thus released. This enables highly efficient thermal control of the image pickup element 12.

Thus, the image pickup element module 10 is configured so that the heat releasing member 54 disposed to be thermally coupled to the FPC substrate 16 and the image pickup element 12 is formed of the synthetic resin material having good thermal conductivity and thus the phase-changing heat storage 46 is disposed to be thermally coupled to the heat releasing member 54 by insert molding.

In this manner, when the image pickup element 12 is driven, the heat passes through the opening 18 of the FPC substrate 16 from the backside insulating sheet 14 and is transferred to the heat releasing member 54, and the heat storage 46 of the heat releasing member 54 then changes phase. Thus, the heat releasing member 54 is kept at a constant temperature and releases the transferred heat, thereby controlling the image pickup element 12 at a predetermined value. As a result, with a simple configuration, the heat of the printed wiring substrate, including the heat of the image pickup element, can be efficiently released via the resin heat releasing member, thereby achieving highly efficient cooling and achieving an improvement in the degree of freedom in manufacture including the thermal design of the module.

Figure 3:
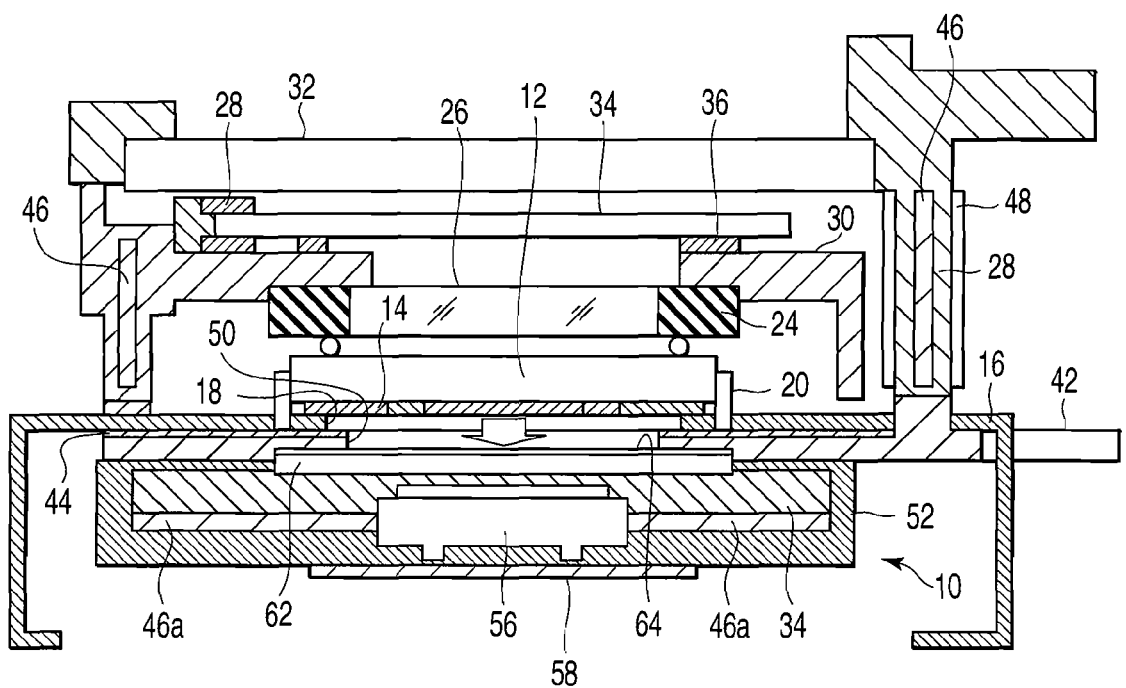
FIG. 3 is a sectional view showing modifications of a heat releasing member and a heat storage in FIG. 1.

Furthermore, the heat releasing member 54 may be formed of a metal material, such as aluminum, instead of PPS synthetic resin material having high thermal conductivity. In this case, as shown in, for example, FIG. 3, a synthetic resin sheet in which a heat storage 46a is covered with the synthetic resin material having good thermal conductivity by insert a molding or a synthetic resin sheet to which a heat storage material is joined is separately formed, and this heat storage 46a is disposed by joining the heat releasing member 54 to the pump connecting member 58. Thus, when the heat from the image pickup element 12 is transferred to the heat releasing member 54 from the heat pipe 52 and the element support member 42, the heat is temporarily absorbed by the heat storage 46a and the heat storage 46a changes phase, so that the heat releasing member 54 is kept at a constant temperature and releases the heat via the pump connecting member 58.

In addition, the heat storage 46a is also configured into the shape of a so-called resin sheet in which a core material is covered with a container, and this core material is, for example, paraffin, an organic heat storage material such as paraffin filled with carbon fiber made of a substance easily transmitting heat and a gel agent capable of maintaining a solid shape even at a melting temperature or more, or paraffin or inorganic hydrated salt filled with a polymer. This heat storage 46a is formed to be able to melt or solidify by changing phase at a temperature equal to or less than the service temperature limit of the image pickup element 12, for example, at 60 to 80° C.

Moreover, while the melting point of the heat storage 46a is set at 60° C. or more, it can be replaced with an inorganic substance (e.g., sodium acetate pentahydrate) which melts at 45° C. to 59° C. Thus, by use of the technique of insert-molding the heat storage 46a into the PPS resin or the adhesive bonding technique of joining the heat storage 46a to a metal material, it is possible to provide a heat releasing plate member with a small area and a small thickness, thereby enabling a reduction in size.

While the bare chip type image pickup element is used here, it can be replaced with a package type image pickup element.

Next, the usage of the image pickup element module 10 is described.

Figure 4:
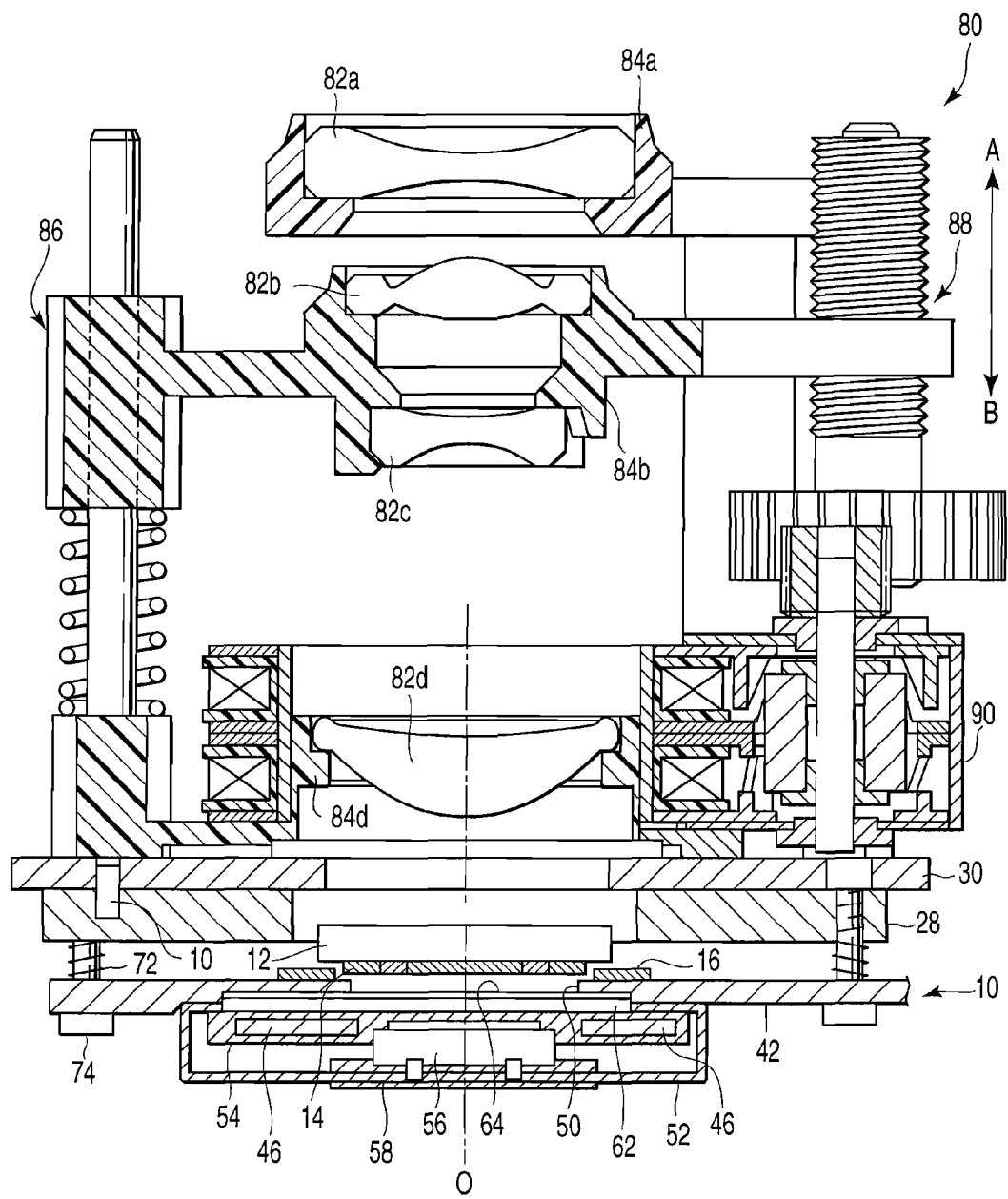
FIG. 4 is a sectional view shown to explain a lens unit using the image pickup element module in FIG. 1.

For example, the image pickup element module 10 is used as the lens unit of the electronic camera, which is a portable electronic device, as shown in FIG. 4. However, in FIG. 4, the optical low pass filter 26, the transparent glass substrate 34 configuring the dust-proof mechanism and the shutter 32 shown in FIG. 1 are omitted for convenience of the drawing, and the same reference numbers are assigned to the same parts as those in FIGS. 1 and 2 described above, and these parts are not described in detail.

That is, the image pickup element module 10 is assembled as follows: for example, the frame member 28 is positioned via a positioning pin 70 at the unit substrate 30 which is a lens main body configuring the lens unit, and in this state, its element support member 42 and frame member 28 are screwed to the unit substrate using a screw member 74 with a helical compression spring 72 in between.

A lens optical system 80 is set on the unit substrate 30. An image pickup lens system is housed and disposed in the lens optical system 80. This image pickup lens system is composed of, for example, four lenses of three groups: a first lens 82a of a first group, second and third lenses 82b and 82c of a second group, and a fourth lens 82d of a third group. Then, the second and third lenses 82b and 82c of the second group are moved in the direction of an optical axis O to perform a focal adjustment.

The first lens 82a and the fourth lens 82d are housed in holders 84a and 84d, respectively, and positioned, fixed and disposed on the optical axis via the holders 84a and 84d. Then, the second and third lenses 82b and 82c are housed in a holder 84b. This holder 84b is supported on, for example, a guide mechanism 86 having a rattle preventing mechanism movably in the directions of arrows A, B corresponding to the optical axis.

This holder 84b is coupled to a linear screw mechanism 88 linearly movably in the directions of the arrows A, B in the optical axis direction. This linear screw mechanism 88 is coupled to, for example, a stepping motor 90 in a freely driven manner, and rotationally driven in conjunction with the driving of the stepping motor 90, thereby linearly moving the holder 84a in the directions of the arrows A, B. At this moment, the holder 84b is moved in the directions of the arrows A, B under the guidance of the guide mechanism 86, and moves the second and third lenses 82b and 82c in the optical axis direction, thereby performing a focal adjustment.

Thus, the image pickup element module 10 configures the lens unit in combination with the lens optical system 80 of the electronic camera, and thus achieves highly efficient cooling and can also achieve an improvement in the degree of freedom in manufacture, as well as the thermal design as described above, thereby allowing a contribution to a reduction in the size of the whole camera.

Moreover, the lens unit may otherwise be configured to be set on the unit substrate 30 using a lens side mount member 100, as shown in FIGS. 5 and 6. This lens side mount member 100 is formed of, for example, a synthetic resin material having good thermal conductivity in which fillers of, for example, a metal oxide or ceramic are mixed, such as a polyphenylene sulfide (PPS) resin in which spheroidal graphite is filled with glass fiber, a carbon resin, etc.

That is, a printed wiring substrate 102 is disposed in the lens side mount member 100. A package type image pickup element 12a is installed on the printed wiring substrate 102 and electrically connected thereto. The light receiving surface of the image pickup element 12a is covered with a protective glass 104.

Then, the loop flat-plate-type heat pipe 52 configuring the phase-changing flow path is disposed on the backside of the printed wiring substrate 102. At the peripheral portion of this heat pipe 52, the heat absorbing surface 64 covered with a heat conductive material such as a silicon sheet or a graphite sheet is provided face to face with the image pickup element. Then, the heat releasing side of the heat pipe 52 is joined to the lens side mount member 100 using an adhesive having good thermal conductivity.

Furthermore, an element support member 106 is set on the backside of the printed wiring substrate 102 via an insulating spacer member 108 so that the height of the element support member 106 can be freely adjusted using a screw member 110. Then, a heat insulating member 112 is interposed between the element support member 106 and the lens side mount member 100. This heat insulating member 112 is a general heat insulating member made of a PPS resin or an ABS resin, or a polyphenylene sulfide (PPS) resin member having good thermal conductivity, in which fillers of, for example, a metal oxide or ceramic are mixed, for example, in which spheroidal graphite is filled with glass fiber, a carbon resin, etc.

Moreover, at a position proximate to the element support member 106, the heat storage 46 which changes phase at 60 to 80° C., which is equal to or less than the service temperature limit of the above-mentioned image pickup element 12a, is insert-molded and thermally coupled to the heat insulating member 112 using the PPS resin. The heat insulating member 112 is joined between the lens side mount member 100 and the element support member 106 using, for example, an infrared setting adhesive. The heat insulating member 112 therefore thermally shields the mount member 100 from the element support member 106 while being kept at a constant temperature by the heat storage 46.

The lens side mount member 100 is provided with an attachment hole 116. The lens side mount member 100 is attached to and disposed on the unit substrate 30 by inserting, for example, an unshown screw member into the attachment hole 116 to connect the screw member to the unit substrate 30. Moreover, a contact terminal substrate 118 is disposed on the proximal side of the lens side mount member 100, and is electrically connected to the side of the camera main body via the contact terminal substrate 118.

Here, the heat storage 46 is disposed to be thermally coupled to the lens side mount member 100 by insert molding. By this heat storage 46, the lens side mount member 100 is kept at a constant temperature of 60 to 80° C., which is equal to or less than the service temperature limit of the image pickup element 12a, thereby thermally controlling the image pickup element 12a at a desired value.

Furthermore, the image pickup element module 10 is provided within, for example, the camera main body 120 configuring the device case of a single lens reflex electronic camera shown in FIG. 7. It is to be noted that, in FIG. 7, the same reference numbers are assigned to the same parts as those in FIGS. 1 and 2 described above, and these parts are not described in detail.

That is, in the single lens reflex electronic camera, an image pickup optical system, a finder optical system and a focus detection optical system are arranged via the frame member 28 in the camera main body 120 made of a synthetic resin material having good thermal conductivity. Among these, the image pickup optical system comprises, in the order of the optical axis, a photography lens group 122a, a half mirror 122b and a reflecting mirror 122c.

This photography lens group 122a is detachably set to the camera main body 120 via a mount. The half mirror 122b is configured to divide the optical path from the photography lens group 122a into the direction of the image pickup element module 10 and the finder optical system. Moreover, the half mirror 122b comprises a quick return mirror which evacuates upward out of a photography optical path in conjunction with the shutter 32.

The reflecting mirror 122c is configured to guide the light from the photography lens group 122a to the focus detection optical system. Further, the reflecting mirror 122c is configured to evacuate upward in conjunction with the half mirror 122b. This mirror is evacuated out of the photography optical path when lifted, such that the light from the photography lens group 122a is guided to the image pickup element module 10. Thus, the photography optical path from the photography lens group 122a is set to be switched between the direction of the image pickup element module and the focus detection optical system.

The focus detection optical system comprises a condenser lens 124a, a reflecting mirror 124b, an aperture stop group 124c, refocusing lenses 124d, a refocusing optical system 124e and a photoelectric conversion element array 124f. The condenser lens 124a is disposed in the vicinity of an estimated imaging surface 122d equivalent to the imaging surface of the photography lens group 122a. The reflecting mirror 124b is disposed to bend the light from the condenser lens 124a so that the light is contained in the camera main body 120 in a compact manner. The aperture stops 124c are pairs of apertures provided in the vertical and horizontal directions. The refocusing lenses 124d are formed integrally with the refocusing optical system 124e to correspond to the aperture stops 124c, thereby configuring the refocusing optical system 124e.

Furthermore, in the combination of a pair of refocusing lenses 124d corresponding to a pair of aperture stops 124c, the centers of the aperture stops 124c and the corresponding refocusing lenses 124d are eccentric from the optical axis of the photography lens group 122a.

The finder optical system comprises a screen 126a disposed on an estimated imaging surface equivalent to the imaging surface of the photography lens group 122a on the optical path in the direction of the reflection by the half mirror 122b, a pentagonal prism 126b and an eyepiece 126c.

Thus, the image pickup element module 10 is set in the camera main body 120, thereby making it possible to achieve highly efficient cooling and an improvement in the degree of freedom in manufacture, including as regards thermal design, as described above.

In addition, the elastically deformable FPC substrate 16 has been used in the configuration in the embodiment described above, but the present invention is not limited to this. It is also possible to use a hard type printed wiring substrate, in which case the same advantageous effects can be expected.

Figure 8A:
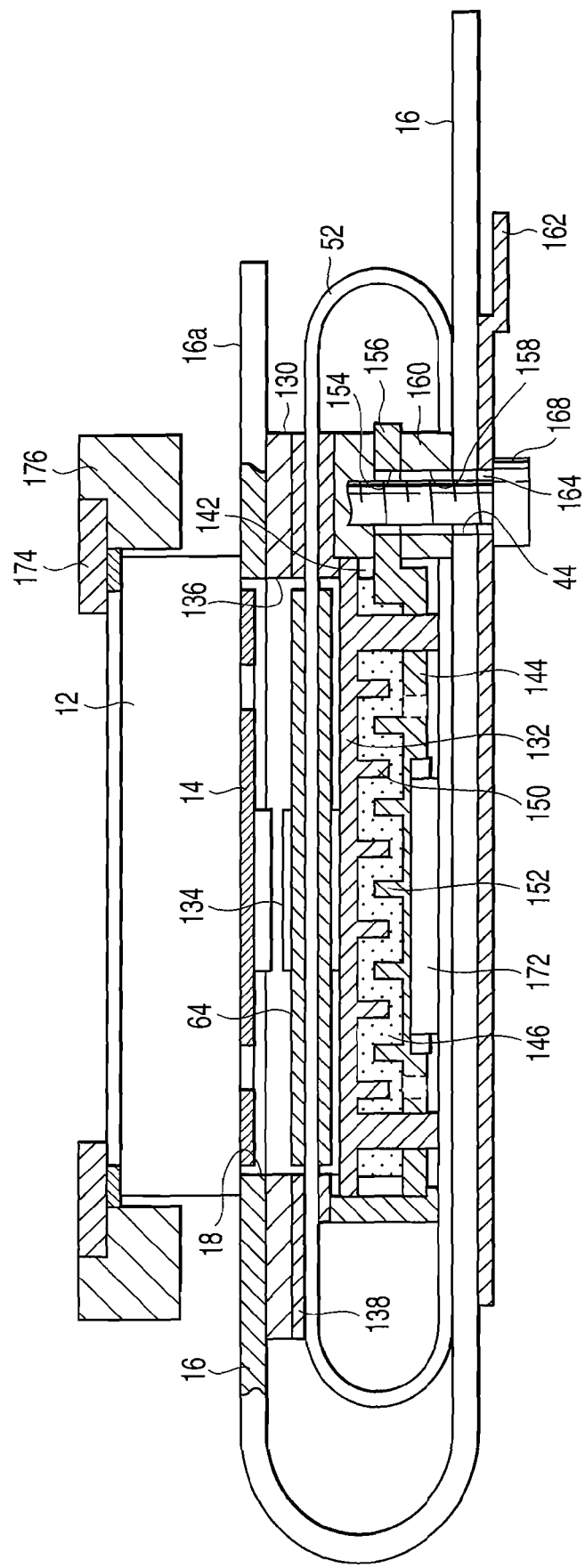
FIG. 8A is a sectional view shown to explain the configuration of an image pickup element module according to another embodiment of the present invention.
Figure 8B:
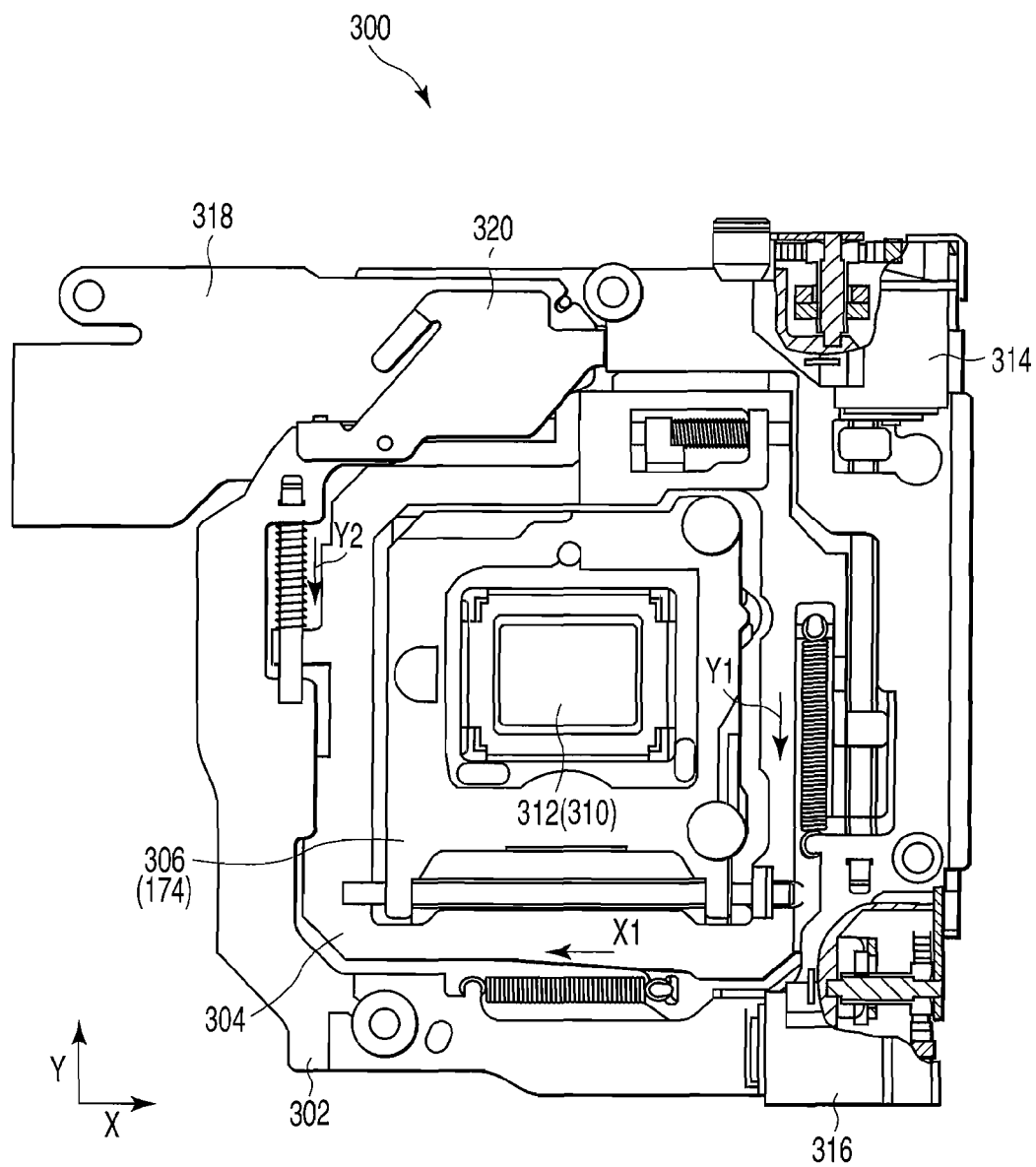
FIG. 8B is a plan view for explaining a hand movement preventing mechanism as a holding member 174 in FIG. 8A.
Figure 9:
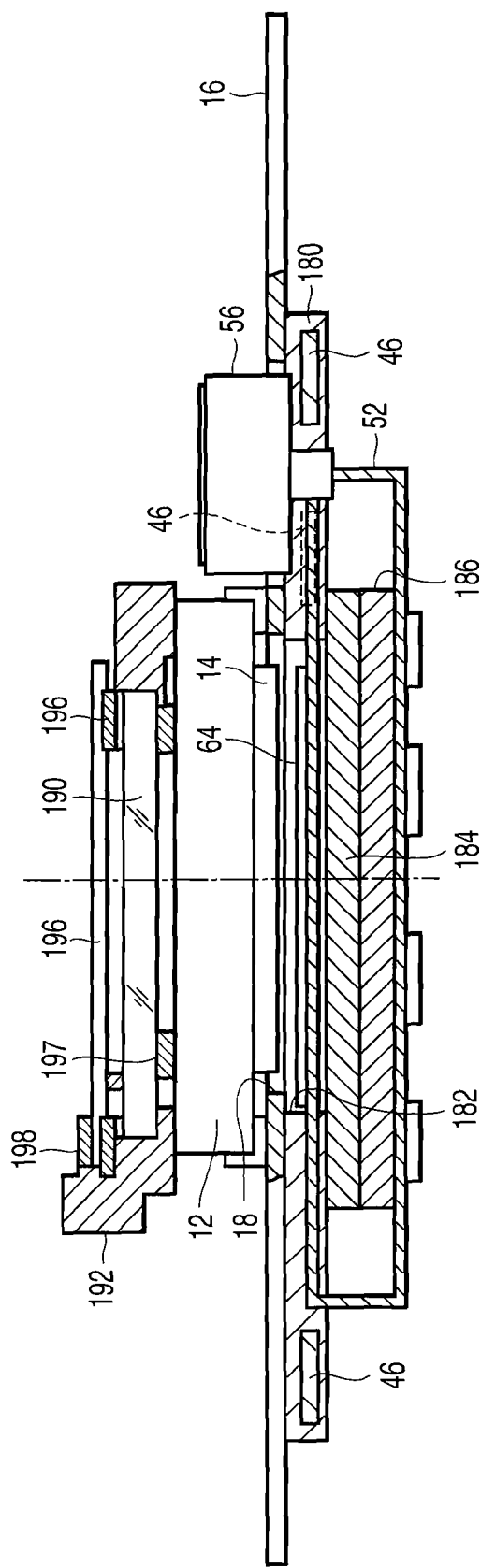
FIG. 9 is a sectional view shown to explain the configuration of an image pickup element module according to another embodiment of the present invention.
Figure 12:
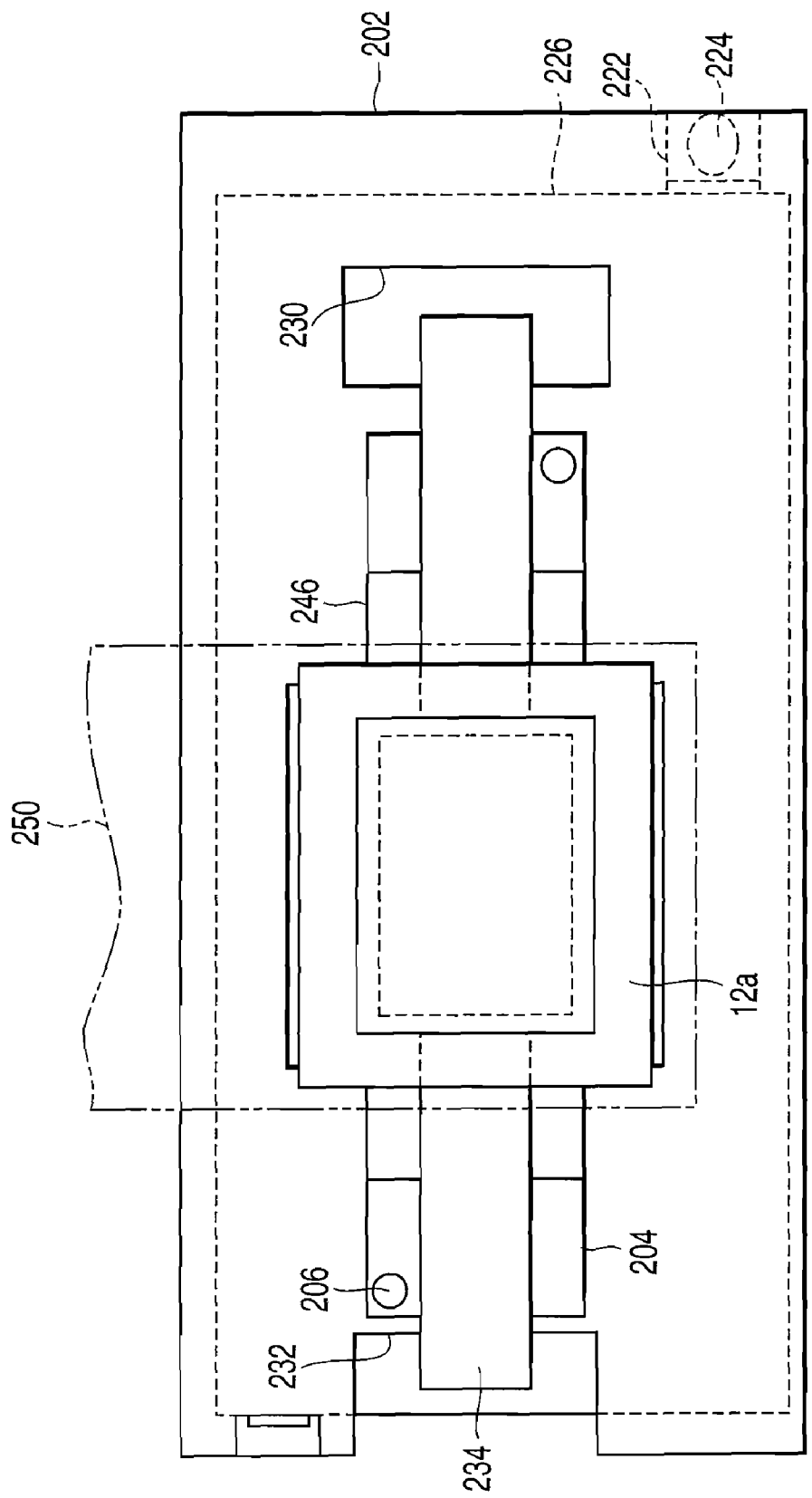
FIG. 12 is a plan view showing the image pickup element module in FIG. 11 from the side of a light receiving surface of an image pickup element.
Figure 13:
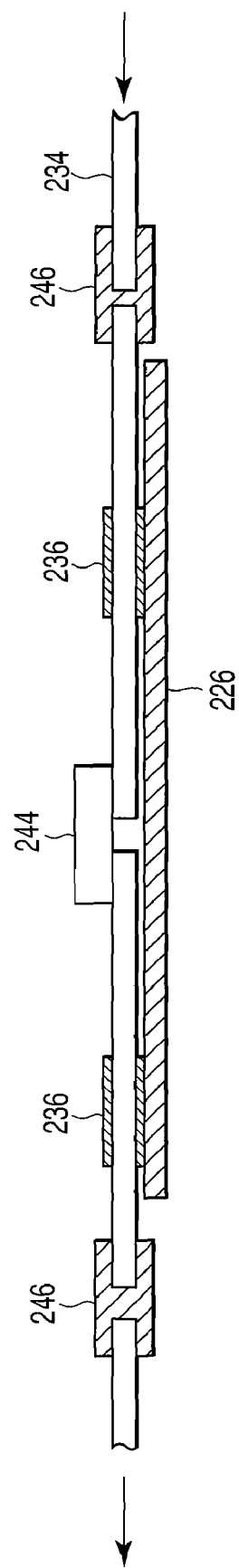
FIG. 13 is a sectional view showing a modification of the image pickup element module in FIG. 11.

Furthermore, the present invention is not limited to the heat releasing structure described above, and, for example, a configuration shown in FIGS. 8, 9 and a configuration shown in FIGS. 11 to 13 are also possible, both of these configurations allowing the same advantageous effects to be expected as in the heat releasing structure according to the embodiment described above. It is to be noted that, in FIGS. 8 to 13, the same reference numbers are assigned to the same parts as those in FIGS. 1 and 5 described above, and these parts are not described in detail.

In the module structure shown in FIG. 8, the backside insulating sheet 14 of the bare chip type image pickup element 12 is installed on and electrically connected to the FPC substrate 16 so that the backside insulating sheet 14 may be contained in the opening 18 provided in the FPC substrate 16. On the backside of the opening 18 of the FPC substrate 16, a part (heat releasing portion) of the loop flat-plate-type heat pipe 52 (e.g., the outer shape of the flat-plate-type heat pipe 52 is a loop, and the width of the pipe is smaller than the dimension of the image pickup element 12 and the same as the width of the backside insulating sheet 14) configuring the phase-changing flow path is disposed face to face with the backside insulating sheet 14. Further, disposed on the backside of the FPC substrate 16 is an insert-molded cylindrical element support member 130 made of a synthetic resin material having good thermal conductivity, such as the PPS resin in which granular graphite is filled with alumina powder and glass fiber or carbon fiber, and one end of this element support member 130 is thermally coupled to the backside of the FPC substrate 16.

Furthermore, in a space between the backside insulating sheet 14 of the image pickup element 12 and a first heat releasing member 132 described later, there are arranged a temperature sensor 134 for detecting the ambient temperature in the vicinity of the image pickup element 12, and electronic components such as an analog front end (AFE) IC element for the retention and gain control of image signals output from the image pickup element 12.

A part at the outer peripheral portion of the heat pipe 52 facing the backside insulating sheet 14 is subjected to, for example, a black alumite treatment to form the heat absorbing surface 64. This heat absorbing surface 64 is blocked from being thermally coupled by thermal conduction to an opening 136 of the element support member 130, and the heat from the backside insulating sheet 14 of the image pickup element 12 is transferred to the heat absorbing surface 64 by thermal convection and thermal radiation. Further, parts of the both sides of the heat pipe 52 across the heat absorbing surface 64 are joined via an adhesive 138 to the element support member 130, and are supported on and thermally coupled by thermal conduction to the element support member 130.

The inner wall of element support member 130 is provided with a fin guide groove 142. First and second heat releasing members 132, 144, which configure a heat releasing members holding a phase-changing heat storage interposed therebetween, are movably contained in the fin guide groove 142. The first and second heat releasing members 132, 144 are formed of, for example, a synthetic resin material having good thermal conductivity in which fillers of, for example, a metal oxide or ceramic are mixed, such as a polyphenylene sulfide (PPS) resin in which spheroidal graphite is filled with glass fiber, a carbon resin, etc.

Furthermore, a heat storage 146 has a so-called heat storing microcapsule structure in which a core material is covered with a container, and this core material is, for example, paraffin, an organic heat storage material such as paraffin filled with carbon fiber made of a substance easily transmitting heat and a gel agent capable of maintaining a solid shape even at a melting temperature or more, or paraffin or inorganic hydrated salt filled with a polymer. The heat storage 146 is formed to be able to melt or solidify by changing phase at a temperature equal to or less than the service temperature limit of the image pickup element 12, for example, at 60 to 80° C. Thus, the heat storage 146 keeps the first and second heat releasing members 132, 144 at a constant temperature of 60 to 80° C., which is equal to or less than the service temperature limit of the image pickup element 12, thereby thermally controlling the image pickup element 12 at a desired value.

The first and second heat releasing members 132, 144 are provided with a plurality of opposite fins 150, 152, and these fins are thermally coupled to each other via the heat storage 146. Of these heat releasing members, the second heat releasing member 144 is provided, at one end thereof, with an attachment portion 156 having a through hole 154. The attachment portion 156 is placed on the element support member 130 so that the through hole 154 of the attachment portion 156 faces an unshown screw hole provided in the element support member 130.

Furthermore, a spacer member 160 having a through hole 158 is stacked on the attachment portion 156. Part of the FPC substrate 16 folded to wrap around the element support member 130 is placed on the spacer member 160. A holding member 162 made of stainless steel or aluminum is stacked and disposed on the FPC substrate 16.

A ceramic sheet 162a is joined to the holding member 162, and this ceramic sheet 162a has a thickness of 0.15 mm and is made of a chemically engraved, saw-toothed or waved plastic material in the form of a lattice having a large number of regular or irregular squares (e.g., one side is about 100 to 500 microns). Moreover, a silicon sheet may be used instead of the ceramic sheet. When such a sheet having high heat releasing properties is used, the holding member 162 may be replaced with, for example, a synthetic resin (e.g., a PPS resin or polycarbonate (PC) resin) which has a thermal conductivity of 1 W/mK or more and which is filled with fillers such as carbon fiber, aluminum powder or aluminum hydroxide.

Furthermore, the surface of the holding member 162 or the surface of a chassis (an unshown main body made of an aluminum or magnesium alloy material) facing the holding member 162 may be ceramic-sputtered or ceramic-coated. Heat generated in the image pickup element is conducted to the holding member 162.

Then, after the heat is conducted from the holding member 162 to the ceramic sheet 162a, infrared rays are released and absorbed between a pair of opposite ceramic sheets spaced at a predetermined distance, such that a temperature rise on the backside of the image pickup element is suppressed, and the heat releasing properties can be enhanced.

Through holes 44, 164 are provided in the FPC substrate 16 and the holding member 162 to correspond to the through hole 158 of the spacer member 160. A screw member 168 is inserted into the through holes 164, 44, 158, 154, and then threaded in a screw hole (not shown) provided to penetrate the element support member 130 on both sides of the heat pipe 52, such that the screw member 168 is positioned and disposed to be thermally coupled to the element support member 130.

Furthermore, the FPC substrate 16 is equipped with, for example, a temperature sensor 172. The temperatures in the first and second heat releasing members 132, 144 are detected by this temperature sensor 172. The temperature sensor 172 detects the ambient temperatures in the first and second heat releasing members 132, 144, and outputs detection signals to an unshown control unit. When this control unit (not shown) detects that the temperatures are equal to or more than a predetermined temperature over a predetermined period of time or more on the basis of the detection signals of the temperature sensor 172, the control unit generates a danger signal, for example, to display a danger such as the stopping of operation on an unshown display unit.

Moreover, a holding member 174 is engaged with the image pickup element 12, for example, at the peripheral portion of image pickup surface of the image pickup element 12. As this holding member 174, for example, a hand movement preventing mechanism disclosed in Jpn. Pat. Appln. No. 2006-222709 by the present applicant is used.

Specifically, as shown in FIG. 8B, a hand movement preventing mechanism 300 mainly comprises: a base 302 serving as a basic component; a first moving frame 304 which is a first moving member supported on the base 302 to be able to displace relative to the base 302; a second moving frame 306 (simply referred to as a moving frame 174 in the present embodiment), which is a second moving member supported on the first moving frame 304, to be able to displace relative to the first moving frame 304; an image pickup element unit 310 supported on the second moving frame 306 and configured to have an image pickup element 312, a first drive mechanism unit fixedly provided in the base 302 and composed of a first motor 314 and a drive mechanism which are a driving source for displacing the image pickup element unit 310 constituted of an assembly of the first moving frame 304, the second moving frame 306 and the image pickup element unit 310 in a Y direction; and a second drive mechanism unit fixedly provided in the base 302 and composed of a second motor 316 and a drive mechanism which are a driving source for displacing the second moving frame 306 and the image pickup element unit 310 in an X direction.

Furthermore, the image pickup element unit 310 mainly comprises: the image pickup element 312; a flexible printed board 318 on which the image pickup element 312 is mounted and which is connected to the image pickup element 312; and an image pickup element holding plate 320 for holding this flexible printed board 318 on the backside of the second moving frame 306. The image pickup element unit 310 is supported on the insert-molded moving frame 174 made of a PPS resin in which granular graphite is filled with glass fiber or carbon fiber.

The holding member 174 is configured to be two-dimensionally moved via a moving frame 176 so that the surface direction of holding member 174 may be kept uniform, thereby enabling a hand movement correction. This moving frame 176 is thermally coupled to the holding member 174 via, for example, unshown coupling means, so that the heat produced by driving of moving frame 176 is discharged via the coupling means.

A module structure shown in FIG. 9 is configured using the bare chip type image pickup element 12, and the opening 18 is formed in the FPC substrate 16 to correspond to the heat from the backside insulating sheet 14 of the image pickup element 12. Further, an element support member 180 configuring a heat release member is disposed face to face with the backside of the opening 18. This element support member 180 is formed of, for example, a synthetic resin material having good thermal conductivity in which fillers of, for example, a metal oxide or ceramic are mixed, such as a polyphenylene sulfide (PPS) resin in which spheroidal graphite is filled with glass fiber, a carbon resin, etc.

The element support member 180 is provided with an opening 182 face to face with the opening 18. In this opening 182, part of the loop flat-plate-type heat pipe 52 configuring the phase-changing flow path is disposed face to face with the backside insulating sheet 14 of the image pickup element 12.

A part at the heat pipe 52 corresponding to the opening 182 of its element support member 180 is likewise subjected to, for example, a black alumite treatment to form the heat absorbing surface 64. This heat absorbing surface 64 is blocked from being thermally coupled by thermal conduction to the opening 182 of the element support member 180 and is also thermally isolated from the heat releasing side of the heat pipe 52 via a heat insulating member 184. The heat from the backside insulating sheet 14 of the image pickup element 12 is transferred to the heat absorbing surface 64 by thermal convection and thermal radiation. Further, parts of the both sides of the heat pipe 52 across the heat absorbing surface 64 are supported on the element support member 180 to be thermally coupled thereto by thermal conduction.

A heat releasing member 186 thermally coupled to, for example, the unshown device case is thermally coupled to the heat releasing side of the heat pipe 52. This heat releasing member 186 supports the heat absorbing surface 64 of the heat pipe 52 via the heat insulating member 184 to set and dispose the heat pipe 52 in the element support member 180. The heat releasing member 186 is formed of, for example, a synthetic resin material having good thermal conductivity in which fillers of, for example, a metal oxide or ceramic are mixed, such as a polyphenylene sulfide (PPS) resin in which spheroidal graphite is filled with glass fiber, a carbon resin, etc. Thus, the heat absorbing surface 64 of the heat pipe 52 is thermally isolated from the heat releasing member 186 by the heat insulating member 184. When the heat from the backside insulating sheet 14 of the image pickup element 12 is transferred by thermal convection and thermal radiation, the working fluid absorbs the heat by phase change and vaporizes, and then liquefies on the heat releasing side, such that the heat is discharged.

In addition, the heat insulating member 184 may be configured so that the heat storage 46 similar to the above-mentioned heat insulating member 112 shown in FIG. 5 is disposed to be thermally coupled thereto by insert molding.

Furthermore, the phase-changing heat storage 46 is disposed to be thermally coupled to the element support member 180 by insert molding. This heat storage 46 has a so-called heat storing microcapsule structure in which a core material is covered with a container, and this core material is, for example, paraffin, an organic heat storage material such as paraffin filled with carbon fiber made of a substance easily transmitting heat and a gel agent capable of maintaining a solid shape even at a melting temperature or more, or paraffin or inorganic hydrated salt filled with a polymer. Further, the heat storage 46 is formed to be able to melt or solidify by changing phase at a temperature equal to or less than the service temperature limit of the image pickup element 12, for example, at 60 to 80° C. Thus, the heat storage 46 keeps the element support member 180 at a constant temperature of 60 to 80° C., which is equal to or less than the service temperature limit of the image pickup element 12, thereby thermally controlling the image pickup element 12 at a desired value.

Moreover, the piezoelectric pump 56 is connected to the heat pipe 52 through a pipe. The piezoelectric pump 56 is supported on and disposed in, for example, the element support member 180, and circulates and supplies the working fluid into the heat pipe 52.

Figure 10:
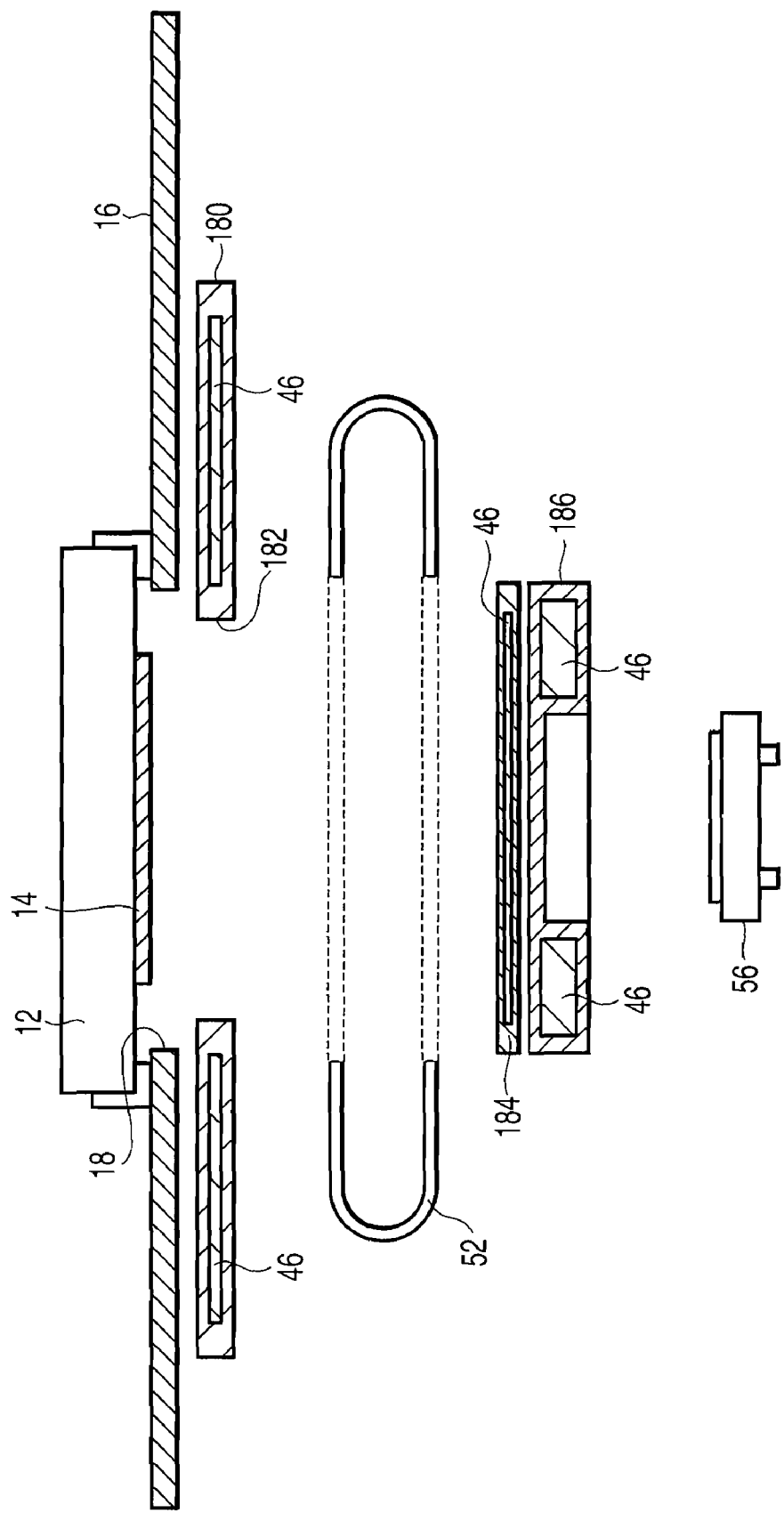
FIG. 10 is an exploded sectional view showing a modification of the image pickup element module in FIG. 8.

Still further, the piezoelectric pump 56 may otherwise be attached to the heat releasing member 186 and then connected to the heat pipe 52 through a pipe, as shown in FIG. 10. Here, the heat storage 46 similar to that of the element support member 180 may be disposed to be thermally coupled to the heat releasing member 186 and the heat insulating member 184 by insert molding (see FIG. 10). Thus, the heat releasing member 186 and the heat insulating member 184 are configured to be kept at a constant temperature of 60 to 80° C., which is equal to or less than the service temperature limit of the image pickup element 12, such that more satisfactory cooling effects can be obtained.

In addition, an optical low pass filter 190 is set on the image pickup element 12 with a packing member 194 interposed therebetween so that the optical low pass filter 190 is supported on a support member 192. A transparent glass substrate 196 configuring a dust-proof mechanism is set on the optical low pass filter 190 so that an oscillating member 196 configured by a piezoelectric element and a press member 198 are interposed therebetween. When the oscillating member 196 is driven via an unshown drive control unit and oscillated, the transparent glass substrate 196 oscillates in an airtight state against the elastic force of the press member 198. Thus, the oscillating member 196 removes, for example, dust adhering to the upper surface of the oscillating member 196 to prevent the dust from entering the optical low pass filter 190.

Furthermore, in the module structure shown in FIGS. 11 and 12, for example, the bare chip type image pickup element 12a is installed on a printed wiring substrate 202 of a so-called hard type via an insert-molded element support member 204 made of a PPS resin filled with granular graphite and carbon fiber or amorphous (glass) fiber. The phase-changing heat storage 46 is disposed to be thermally coupled to an element support member 204 by insert molding. This heat storage 46 has a so-called heat storing microcapsule structure in which a core material is covered with a container, and this core material is, for example, paraffin, an organic heat storage material such as paraffin filled with carbon fiber, or paraffin or inorganic hydrated salt filled with a polymer. The heat storage 46 is formed to be able to melt or solidify by changing phase at a temperature equal to or less than the service temperature limit of the image pickup element 12, for example, at 60 to 80° C. Thus, the heat storage 46 keeps the element support member 204 at a constant temperature of 60 to 80° C., which is equal to or less than the service temperature limit of the image pickup element 12.

A positioning pin 206 is projectingly provided in the element support member 204 face to face with the printed wiring substrate 202. This positioning pin 206 is inserted into an insertion hole 208 formed in the printed wiring substrate 202, such that the printed wiring substrate 202 and the element support member 204 are positioned and set relative to each other. This enables the image pickup element 12a to be set so that the optical axis of the light receiving surface of the image pickup element 12a coincides with an image pickup lens.

An opening 210 and an opening 212 are provided in the element support member 204. Further, lead terminals 20a projecting from the backside of the image pickup element 12a are inserted therethrough across the element support member 204, and the lead terminals 20a are electrically connected to the printed wiring substrate 202 by, for example, solder.

Furthermore, a shield member 220 containing, for example, a backlight 216 and a liquid crystal display (LCD) 218 configuring an electronic camera is set on the backside of the printed wiring substrate 202 using an attachment member 222 and a screw member 224. Moreover, without providing a backside insulating sheet 14a of the image pickup element 12a and the opening 210 and the opening 212 provided in the image pickup element support member 204, the image pickup element 12a and the element support member 204 may be thermally coupled to each other by thermal conduction alone.

The shield member 220 is formed of, for example, aluminum having good thermal conductivity, and is thermally coupled by thermal conduction and set to a rear cover 226 which is, for example, a device case and which configures the electronic camera. This rear cover 226 configures a camera case with an unshown front cover and a middle frame.

An opening 230 and a cutout 232 are provided at a predetermined distance in the printed wiring substrate 202 to correspond to a heat pipe 234. The loop heat pipe 234 configuring a phase-changing flow path is inserted through the opening 230 and the cutout 232, and the heat pipe 234 is laid from the upper side to backside of the printed wiring substrate 202.

Used as this heat pipe 234 is, for example, a heat pipe having good thermal conductivity, such as one manufactured by Nippon Metal Industry Co., Ltd. mentioned above in which a wick is formed. The heat pipe 234 uses a phase change, wherein, when heat is applied to the heat absorbing side of the heat pipe 234 from the backside of the image pickup element 12a, the working fluid vaporizes by drawing the heat owing to the capillary phenomenon, and reduces the air pressure and then flows to a low pressure side at the other end. On the backside of the printed wiring substrate 202, the heat pipe 234 is supported on and thermally coupled by thermal conduction to the shield member 220 via a plurality of pipe support members 236 formed of, for example, aluminum having good thermal conductivity.

In the heat pipe 234 having a capillary function called a "wick" in the inner wall of the heat pipe 234, the condensed working fluid again reflows to the heat absorbing side due to the capillary tube of the wick, and the cycle of vaporization, condensation and reflow is carried out, so that a temperature rise in the image pickup element 12a can be suppressed. Further, the printed wiring substrate 202 is equipped with a temperature sensor using a space (supported by an unshown interposed rubber material having high thermal conductivity) between the pipe support members 236, and the temperature sensor is electrically connected to the printed wiring substrate 202 via a lead wire 240.

In addition, a piezoelectric pump 244 may be connected through a pipe between the pipe support members 236 of the heat pipe 234 as shown in FIG. 13, instead of a temperature sensor 242. Moreover, the heat pipe 234 can be configured so that the heat pipe 234 is connected by an axially elastic bellows type connecting pipe 246 in the vicinity of the heat pipe 234 that is supported by the pipe support members 236, thereby making it possible to provide a simple pipe connection.

Here, when the heat from the backside insulating sheet 14a of the image pickup element 12a is transferred to the heat pipe 234 by convection and thermal radiation through the opening 212 and the opening 210 of the element support member 204, the working fluid therein absorbs the heat by phase change and vaporizes, and then liquefies on the heat releasing side, such that the heat is discharged. At the same time, the heat of the image pickup element 12a is transferred by thermal conduction to the shield member 226 via a package main body 248, the element support member 204 and the printed wiring substrate 202, and thus released. At this moment, the heat storage 46 of the element support member 204 absorbs the heat and changes phase, such that the element support member 204 is kept at a constant temperature and the heat release is promoted.

Furthermore, for the heat generated by electronic components such as a central processing unit (CPU) and an AFEIC element mounted on the printed wiring substrate 202, a heat conducting material such as a silicon sheet is interposed between the backside of a component mounting part of the printed wiring substrate 202 the shield member 226, such that the printed wiring substrate 202 is thermally coupled to the shield member 226 to directly conduct the heat to the shield member 226. Thus, the heat of the electronic components mounted on the printed wiring substrate 202 is prevented from being conducted to the element support member 204 and efficiently released via the shield member 226, thereby simplifying the configuration of the element support member 204.

In addition, the outer peripheral portion of the heat pipe 234 facing the opening 210 of the element support member 204 may be subjected to, for example, a black alumite treatment to form a heat absorbing surface. This can promote the transfer of the heat from the image pickup element 12a to the heat pipe 234 by thermal convection and thermal radiation.

Furthermore, this module structure may be configured using an FPC substrate (indicated by a chain double-dashed line in FIG. 12) 250 formed into a free shape instead of the printed wiring substrate 202. In this case, the FPC substrate 250 is configured to be drawn in a direction perpendicular to the laying direction of the heat pipe 234, such that a connector for electrically connecting the FPC substrate 250 does not interfere with the heat pipe 234, enabling the simplification of the assembly.

In addition, while the heat pipe 52, 234 is set and disposed in the configuration in each of the embodiments described above, the present invention is not limited to this, and it is also possible to provide a configuration in which the heat pipe 52, 234 is not set and disposed. When the heat pipe 52, 234 is omitted in this manner, an operation module is simplified and reduced in size.

As described above, according to the present invention, it is possible to provide an image pickup element module, and a lens unit and a portable electronic device using image pickup element modules, wherein with a simple configuration, it is possible to achieve a highly efficient thermal transfer to obtain higher cooling efficiency and achieve an improvement in the degree of freedom in manufacture including a thermal design.

While the embodiments of the present invention have been described above, it should be understood that the present invention is not limited to the embodiments described above and various modifications can be made without departing from the spirit of the present invention. For example, in the configuration in which the glass substrate is joined to a silicon substrate as a semiconductor substrate, the glass substrate can be replaced with a semiconductor substrate, and the semiconductor substrates can be joined to each other.

Furthermore, the embodiments described above include inventions at various stages, and suitable combinations of a plurality of disclosed constitutional requirements permit various inventions to be extracted. For example, the problems described in the section BACKGROUND OF THE INVENTION can be solved and the advantages described in the section BRIEF SUMMARY OF THE INVENTION can be obtained even if some of all the constitutional requirements shown in the embodiments are eliminated, a configuration in which those constitutional requirements are eliminated can be extracted as an invention.

Moreover, the present invention also makes it possible to obtain the following configurations in accordance with the above-described embodiments shown in FIGS. 5 and 11.

(i) An image pickup element module comprising:
an image pickup element;
a printed wiring substrate electrically connected to the image pickup element;
a heat releasing member which is made of a synthetic resin material having good thermal conductivity and which is thermally coupled to the printed wiring substrate and the image pickup element; and
a heat storage made of a phase-changing material which is part of the heat releasing member and which is insert-molded in the vicinity of the image pickup element.

(ii) A lens unit comprising:
a lens main body to which an image pickup lens is attached;
an image pickup element located in the center of the optical axis of the lens main body;
a printed wiring substrate electrically connected to the image pickup element;
a first heat releasing member which is made of a metal material and which is thermally coupled to the printed wiring substrate and the image pickup element;
a second heat releasing member which is made of a synthetic resin material having high thermal conductivity in which an optical element is disposed; and
a phase-changing heat storage which is insert-molded in the vicinity of a position where the second heat releasing member is coupled to the first heat releasing member.

(iii) A portable electronic device comprising:
a device case which is made of a synthetic resin material having high thermal conductivity and in which an optical element equipped with an image pickup lens is disposed;
an image pickup element located in the center of the optical axis of the image pickup lens;
a printed wiring substrate electrically connected to the image pickup element;
a heat releasing member which is made of a metal material and which is thermally coupled to the printed wiring substrate and the image pickup element;
a heat storage made of a phase-changing material which is disposed to be thermally coupled to the device case by insert molding; and a display unit which is provided in the device case and which displays image data acquired in the image pickup element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image pickup element module comprising:
a printed wiring substrate provided with an opening;
an image pickup element installed on the printed wiring substrate;
a resin heat releasing member which is made of a synthetic resin material filled with fillers having high thermal conductivity and which is disposed to be thermally coupled to the printed wiring substrate and the image pickup element; and
a phase-changing heat storage which is disposed to be thermally coupled to the resin heat releasing member and which is insert-molded or formed into a sheet shape;
wherein the resin heat releasing member is formed of first and second resin heat releasing members, and the heat storage is integrally embedded between the first and second resin heat releasing members.

2. The image pickup element module according to claim 1, wherein
the heat storage causes a phase change at a temperature below the service temperature limit of the image pickup element.

3. The image pickup element module according to claim 2, wherein
the core material of the heat storage is formed of a low melting point metal made of an alloy containing lead, bismuth, tin and cadmium as elements thereof, or an organic material such as paraffin or wax.

4. The image pickup element module according to claim 1, wherein
the core material of the heat storage is formed of a low melting point metal made of an alloy containing lead, bismuth, tin and cadmium as elements thereof, or an organic material such as paraffin or wax.

5. A lens unit comprising:
a lens main body to which an image pickup lens is attached; and
an image pickup element module disposed face to face with the image pickup lens of the lens main body;
the image pickup element module including:
a printed wiring substrate provided with an opening;
an image pickup element installed on the printed wiring substrate;
a resin heat releasing member which is made of a synthetic resin material filled with fillers having high thermal conductivity and which is disposed to be thermally coupled to the printed wiring substrate and the image pickup element; and
a phase-changing heat storage which is disposed to be thermally coupled to the resin heat releasing member and which is inserted-molded or formed into a sheet shape,
wherein the resin heat releasing member is formed of first and second resin heat releasing members, and the heat storage is integrally embedded between the first and second resin heat releasing members.

6. The lens unit according to claim 5, wherein
the heat storage causes a phase change at a temperature below the service temperature limit of the image pick up element.

7. The lens unit according to claim 6, wherein
the core material of the heat storage is formed of a low melting point metal made of an alloy containing lead, bismuth, tin, and cadmium as elements thereof, or an organic material such as paraffin or wax.

8. The lens unit according to claim 5, wherein
the core material of the heat storage is formed of a low melting point metal made of an alloy containing lead, bismuth, tin, and cadmium as elements thereof, or an organic material such as paraffin or wax.

* * * * *